US012685227B2

(12) United States Patent
Tanaka et al.

(10) Patent No.: US 12,685,227 B2
(45) Date of Patent: Jul. 14, 2026

(54) ACTIVE MATRIX DEVICE

(71) Applicant: Sharp Display Technology Corporation, Kameyama City (JP)

(72) Inventors: Kohhei Tanaka, Kameyama City (JP); Kaoru Yamamoto, Kameyama City (JP); Keiichi Yamamoto, Kameyama City (JP); Ryo Yonebayashi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 375 days.

(21) Appl. No.: 18/378,106

(22) Filed: Oct. 9, 2023

(65) Prior Publication Data

US 2024/0162214 A1 May 16, 2024

(30) Foreign Application Priority Data

Nov. 15, 2022 (JP) ................................. 2022-182629

(51) Int. Cl.
| | |
|---|---|
| *H10W 90/00* | (2026.01) |
| *G02F 1/1345* | (2006.01) |
| *G02F 1/167* | (2019.01) |
| *H10D 86/40* | (2025.01) |
| *H10D 86/60* | (2025.01) |
| *H10K 59/90* | (2023.01) |

(52) U.S. Cl.
CPC ......... *H10W 90/00* (2026.01); *G02F 1/13452* (2013.01); *G02F 1/167* (2013.01); *H10D 86/411* (2025.01); *H10D 86/423* (2025.01); *H10D 86/441* (2025.01); *H10D 86/60* (2025.01); *H10K 59/90* (2023.02)

(58) Field of Classification Search
CPC ....... H01L 25/18; H01L 25/162; G02F 1/167; G02F 1/1368; G02F 1/1362; G02F 1/13306; G02F 1/136286; G02F 1/1685; H10K 59/90; H10K 59/1213; H10K 59/131; H10D 30/67; G09G 3/20; G09G 3/36; G09F 9/33; G09F 9/335; G09F 9/35; G09F 9/372; H10H 20/857
See application file for complete search history.

(56) References Cited

U.S. PATENT DOCUMENTS

| | | | |
|---|---|---|---|
| 2014/0254111 A1 | 9/2014 | Yamazaki et al. | |
| 2017/0148826 A1* | 5/2017 | Choi .................... | H10D 86/411 |
| 2018/0151106 A1* | 5/2018 | Peng .................... | G09G 3/3666 |

(Continued)

FOREIGN PATENT DOCUMENTS

| | | |
|---|---|---|
| JP | 2002-372722 A | 12/2002 |
| JP | 2014-197181 A | 10/2014 |

*Primary Examiner* — Fernando L Toledo
*Assistant Examiner* — Adam S Bowen
(74) *Attorney, Agent, or Firm* — ScienBiziP, P.C.

(57) ABSTRACT

A display device includes an active matrix substrate including a plurality of pixels and a driver unit. The driver unit includes a flexible substrate, a first wiring pattern disposed on the flexible substrate, a demultiplexer circuit or a multiplexer circuit supported by the flexible substrate and connected to the first wiring pattern, and a source driver IC supported by the flexible substrate and connected to the first wiring pattern. The driver unit is connected to a display panel, and a TFT of the plurality of pixels and a TFT of the demultiplexer circuit or the multiplexer circuit have semiconductors different from each other.

19 Claims, 22 Drawing Sheets

(56)　　　　　　References Cited

U.S. PATENT DOCUMENTS

| | | | |
|---|---|---|---|
| 2019/0130842 A1* | 5/2019 | Jang ..................... | G09G 3/3266 |
| 2020/0411629 A1* | 12/2020 | Kim ................... | H10K 59/8791 |
| 2021/0005135 A1* | 1/2021 | Kim .................... | G09G 3/3225 |
| 2021/0035519 A1* | 2/2021 | Tagawa ................ | G09G 3/3688 |
| 2022/0199035 A1* | 6/2022 | Choi .................... | G09G 3/3275 |

* cited by examiner

ACTIVE MATRIX DEVICE

BACKGROUND

1. Field

The present disclosure relates to an active matrix device.

2. Description of the Related Art

In recent years, there has been a demand for a display device which can display an image with higher definition. In such a display device, pixels are disposed at high density, and a large number of signal lines for applying display data signals to the pixels are disposed. Each of the signal lines is connected to a driver IC. Therefore, as the number of the pixels increases, more packaged driver ICs are mounted on an active matrix substrate of the display device.

However, when the number of the driver ICs increases, a wider frame region is provided on the active matrix substrate. Consequently, in some cases, there may be a problem such as increased mounting costs of the driver ICs. Therefore, it is conceivable to partially incorporate functions of the driver IC into the active matrix substrate. For example, Japanese Unexamined Patent Application Publication No. 2002-372722 discloses a display device including a demultiplexer circuit which can serially receive display data signals including RGB information and can output the RGB information in parallel.

When an active matrix device is an input device such as a fingerprint sensor, the number of detected signals increases as detection resolution increases. Therefore, when the active matrix device is the input device, in some cases, detected signals may be multiplexed by a multiplexer, and multiplexed signals may be processed by a detection IC.

An aspect of the present disclosure is to provide an active matrix device which includes a demultiplexer or a multiplexer and which ensures a high degree of freedom in designing.

SUMMARY

An active matrix device according to an embodiment of the present disclosure includes an active matrix substrate including a substrate, a plurality of pixels disposed on the substrate, a plurality of source bus lines connected to the plurality of pixels, and a first substrate terminal disposed on the substrate and connected to each of the plurality of source bus lines, and a driver unit. The driver unit includes a flexible substrate, a first wiring pattern disposed on the flexible substrate, a demultiplexer circuit or a multiplexer circuit supported by the flexible substrate and connected to the first wiring pattern, a source driver IC disposed on the flexible substrate and connected to the first wiring pattern, and a first output terminal disposed on the flexible substrate and connected to the first wiring pattern. The first output terminal is connected to the first substrate terminal. The plurality of pixels and the demultiplexer circuit or the multiplexer circuit each include a TFT. The TFT of the plurality of pixels and the TFT of the demultiplexer circuit or the multiplexer circuit have semiconductors different from each other.

BRIEF DESCRIPTION OF THE DRAWINGS

FIG. 11 is a schematic plan view of a driver unit of a display device according to a third embodiment;

FIG. 12 is a schematic plan view illustrating a major configuration of the display device according to the third embodiment;

FIG. 13 is a schematic plan view of a driver unit of a display device according to a fourth embodiment;

FIG. 14 is a schematic plan view of an active matrix substrate of the display device according to the fourth embodiment;

FIG. 15 is a schematic plan view of a driver unit of another example of the display device according to the fourth embodiment;

DESCRIPTION OF THE EMBODIMENTS

Figure 1:
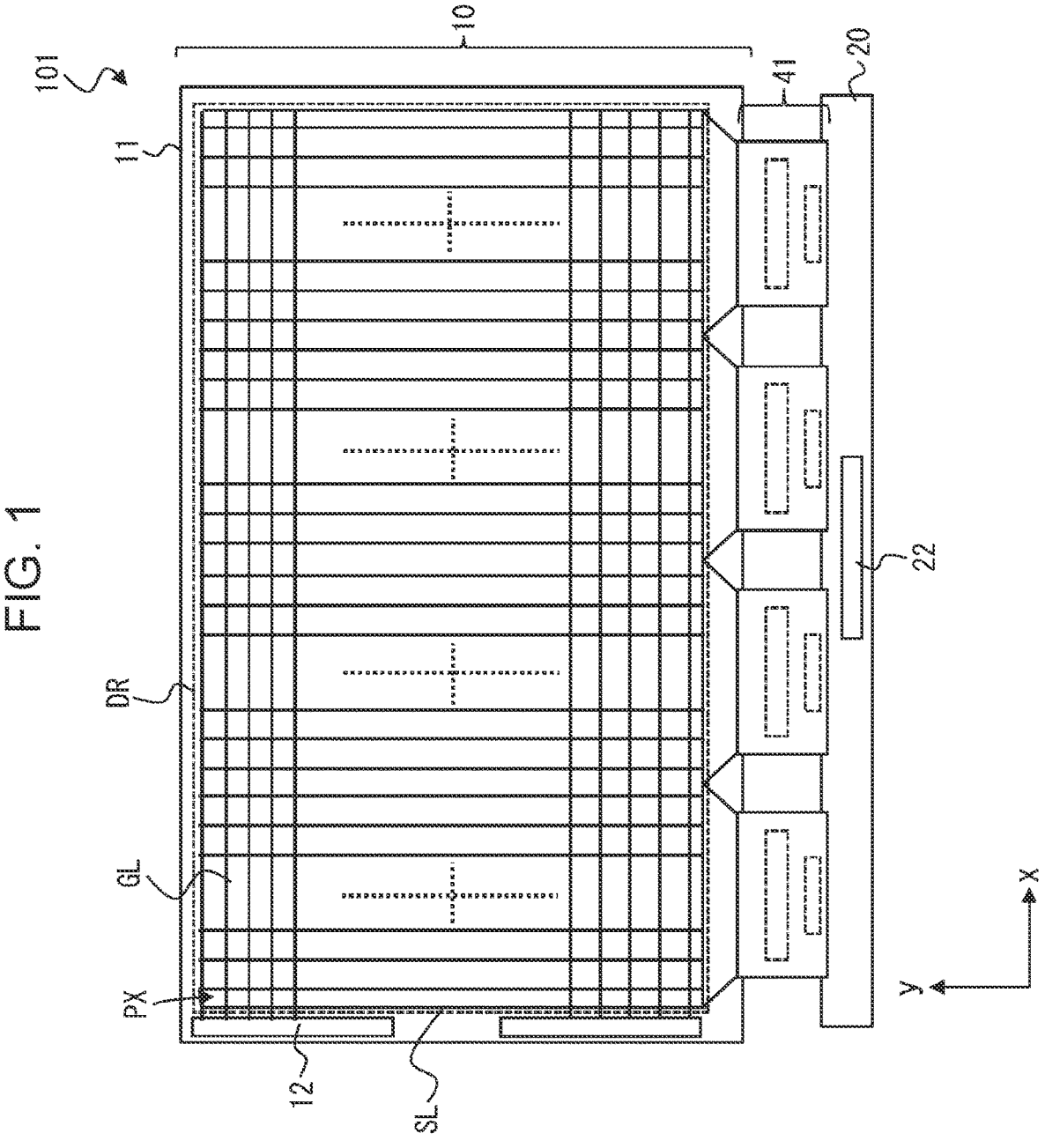
FIG. 1 is a schematic plan view illustrating a major configuration of a display device according to a first embodiment.

Since a demultiplexer circuit is operated at a high speed, a TFT forming the demultiplexer circuit has high driving capability. It is preferable that such a TFT is formed by, for example, using a polysilicon (polycrystalline silicon) semiconductor. Therefore, it is preferable that an active matrix substrate including the demultiplexer circuit is formed by using polysilicon.

However, when the active matrix substrate is used for a display device, it is generally difficult to form the polysilicon by using a large mother glass substrate. Therefore, this method is disadvantageous in terms of productivity. In addition, the TFT formed of polycrystalline silicon generally has a large leakage current when power is turned off. Therefore, it is difficult to manufacture an active matrix substrate achieving low power consumption.

On the other hand, the TFT formed of an oxide semiconductor has a small leakage current when the power is turned off, and from a viewpoint of the low power consumption, the oxide semiconductor is superior to the polysilicon. In addition, it is relatively easy to form an oxide semiconductor layer on the large mother glass substrate.

However, the oxide semiconductor generally has low driving capability. Therefore, an area of the TFT increases to form the demultiplexer, and accordingly, an area of the demultiplexer circuit increases. Therefore, a non-display region in the active matrix substrate increases.

It is conceivable that the TFT in a display region of the active matrix substrate is formed of the oxide semiconductor and the demultiplexer circuit is formed of the polysilicon. However, in this case, processes for forming the semiconductor increase, and thus, manufacturing costs increase. In view of these problems, the inventor of the present application has conceived of a new active matrix device.

Hereinafter, embodiments of the present disclosure will be described with reference to the drawings. The present disclosure is not limited to the following embodiments, and design can be appropriately changed within the scope of satisfying a configuration of the present disclosure. In addition, in the following description, the same reference numerals are used in common for the same elements or elements having similar functions in different drawings, and repeated description thereof may be omitted in some cases. In addition, each configuration described in the embodiments and modification examples may be appropriately combined or changed within the scope not departing from the concept of the present disclosure. In order to facilitate understanding, in the drawings referred to below, the configuration is illustrated in a simplified or schematic form, or some configuration members may be omitted in some cases. In addition, a dimensional ratio between the configuration members illustrated in each drawing does not necessarily indicate an actual dimensional ratio.

First Embodiment

An active matrix device of the present embodiment is a display device. The display device of the present embodiment includes a display panel and a driver unit that drives the display panel. The display panel may be a display panel including an active matrix substrate having a TFT in a pixel as will be described later. Examples of the display panel are a liquid crystal display panel, an organic EL display panel, a micro LED display panel, and an electrophoretic display panel.

Figure 2:
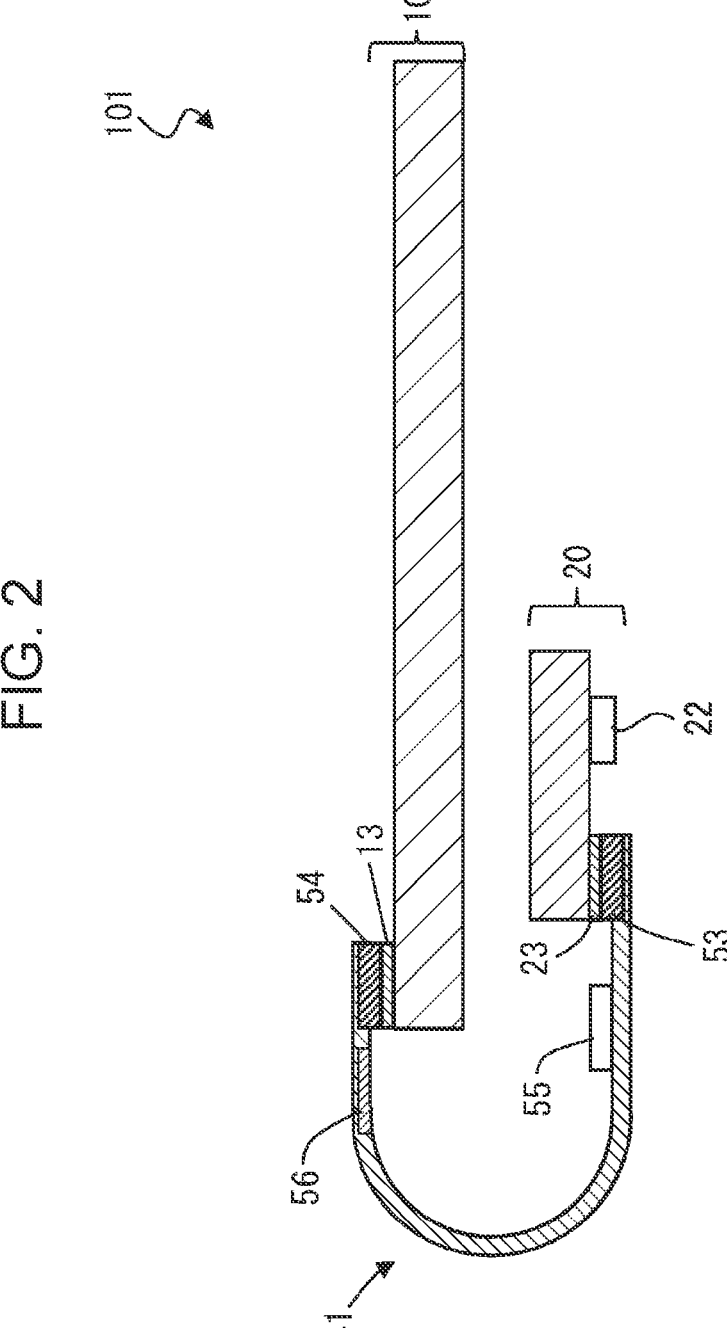
FIG. 2 is a schematic sectional view illustrating the major configuration of the display device of the first embodiment.

FIGS. 1 and 2 are a schematic plan view and a schematic sectional view which illustrate a major configuration of a display device 101 of the present embodiment. The display device 101 includes an active matrix substrate 10 included in a display panel, a driver unit 41, and a control substrate 20. In the present embodiment, the display panel is, for example, a liquid crystal display panel.

The active matrix substrate 10 includes a substrate 11, a plurality of gate bus lines GL, a plurality of source bus lines SL, and a plurality of pixels PX. For example, the substrate 11 is a transparent substrate formed of glass or a resin. However, the substrate 11 may have physical properties according to characteristics of the display panel. For example, when the display panel is a micro LED display panel, the substrate 11 may not be transparent since a micro LED is disposed on the substrate 11.

In a display region DR of the substrate 11, for example, the plurality of gate bus lines GL extending in an x-direction are disposed in a y-direction. In addition, the plurality of source bus lines SL extending in the y-direction are disposed in the x-direction. The pixels PX are each disposed in a region surrounded by a pair of adjacent gate bus lines GL and a pair of adjacent source bus lines SL. The pixels PX are disposed in a two dimensional manner in the x-direction and the y-direction.

Figure 3:
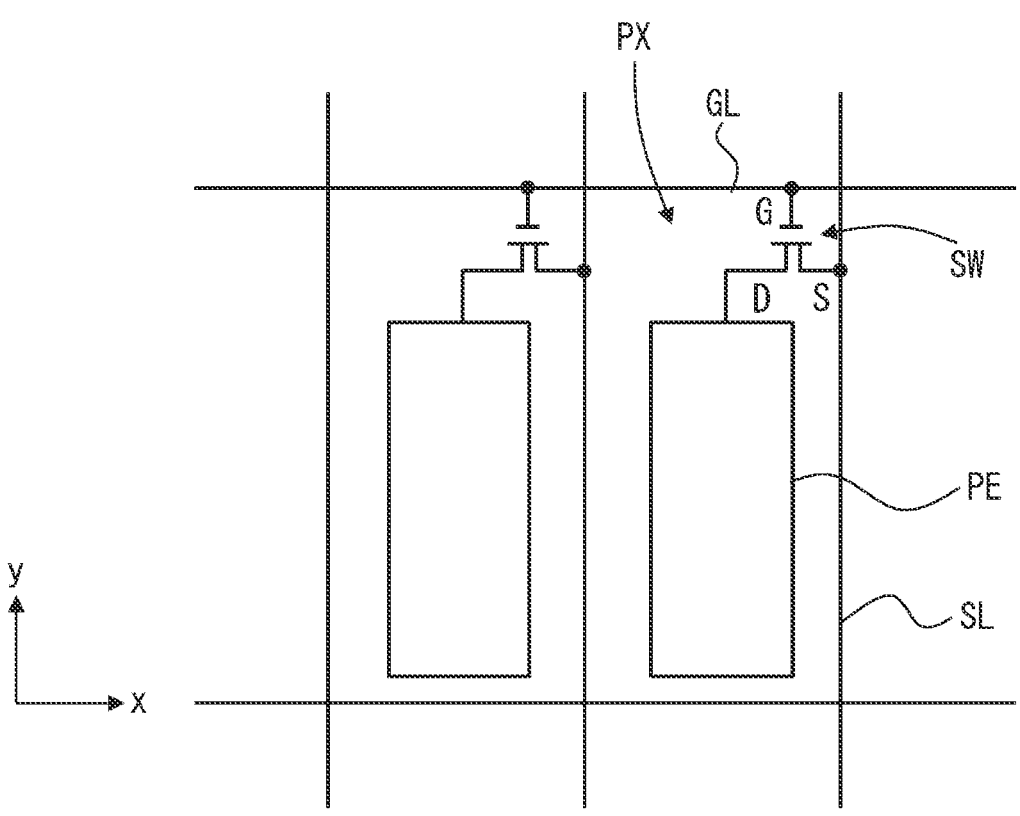
FIG. 3 is a schematic circuit diagram illustrating a configuration of a pixel.

FIG. 3 is a schematic circuit diagram illustrating a configuration of the pixel PX. The pixel PX includes a pixel electrode PE and a switch element SW. The switch element SW is a TFT in the present embodiment. A gate G of the TFT is connected to the gate bus line GL, and a source S is connected to the source bus line SL. A drain D is connected to the pixel electrode PE.

It is preferable that the TFT includes an oxide semiconductor containing at least one metal element selected from In, Ga, and Zn. For example, the TFT may include a semiconductor layer made of an In—Ga—Zn—O-based semiconductor or an In—Sn—Zn—O-based semiconductor. In addition, the oxide semiconductor may be an amorphous oxide semiconductor or a crystalline oxide semiconductor having a crystalline portion.

In addition, from a viewpoint of manufacturing the display device 101 at low costs, the TFT may contain amorphous silicon.

Figure 4:
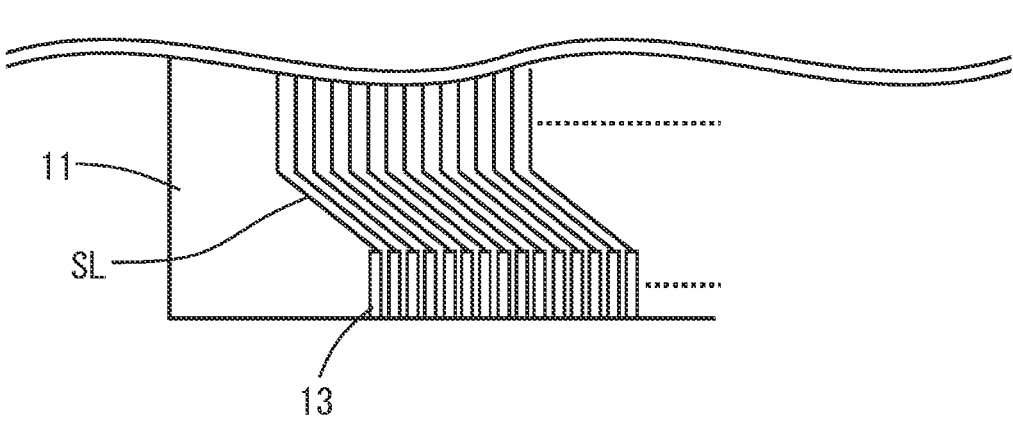
FIG. 4 is a schematic plan view illustrating a part of an active matrix substrate.

As illustrated in FIG. 4, a first substrate terminal 13 is disposed in one end of the source bus line SL. The first substrate terminal 13 is electrically connected to the driver unit 41 as will be described later.

A gate driver 12 is disposed in a non-display region outside the display region DR of the substrate 11 and is connected to the gate bus line GL. The gate driver 12 may be, for example, a bare chip or a packaged IC and may be monolithically formed on the active matrix substrate 10 similarly to the switch element SW.

Figure 5:
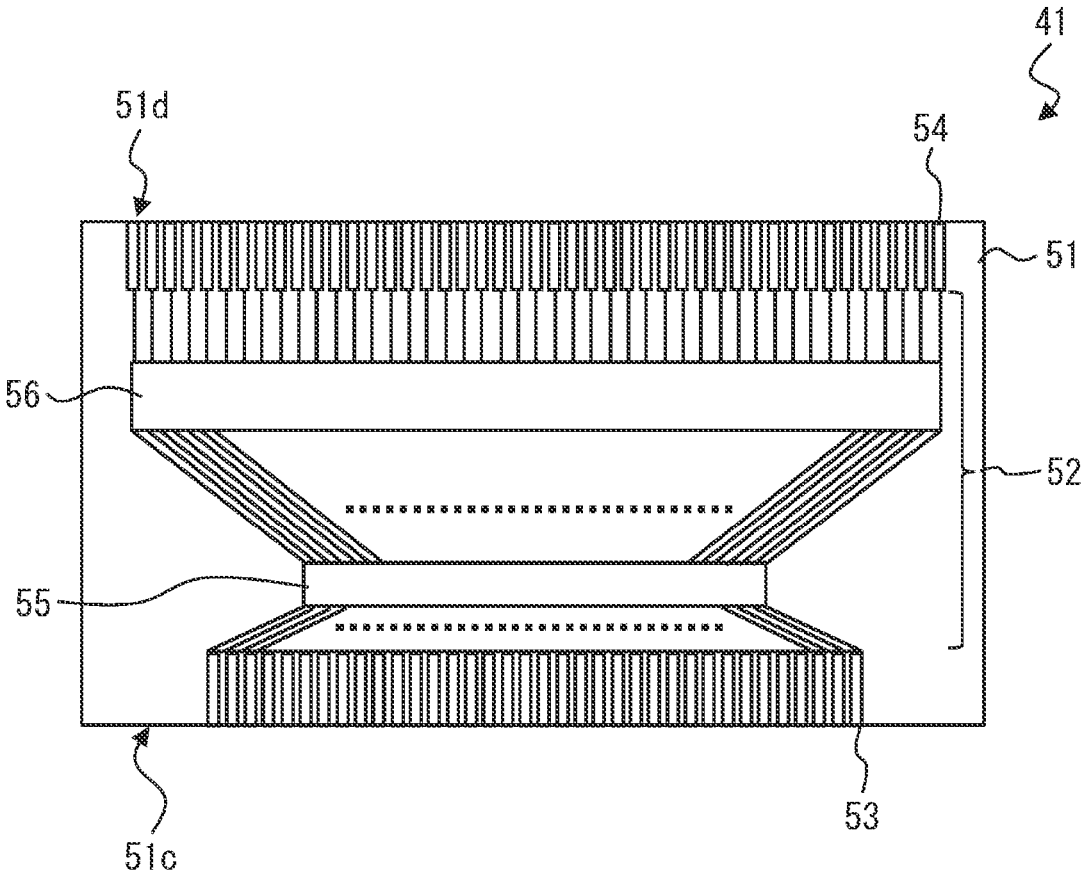
FIG. 5 is a schematic plan view of a driver unit.

FIG. 5 is a schematic plan view of the driver unit 41. The driver unit 41 includes a flexible substrate 51, a first wiring pattern 52, a first input terminal 53, a first output terminal 54, a source driver IC 55, and a demultiplexer circuit 56. The driver unit 41 functions as wiring that connects the control substrate 20 and the active matrix substrate 10 and provides a region for supporting a driver that drives the active matrix substrate 10. In the present embodiment, the display device 101 includes four driver units 41, and each driver unit 41 includes one source driver IC 55 and one demultiplexer circuit 56.

The flexible substrate 51 is a flexible and insulating support base. For example, the flexible substrate 51 is formed of a resin material such as a polyimide film, which is used for a flexible printed circuit (FPC). For example, the flexible substrate 51 has a rectangular shape. For example, a width of the flexible substrate 51 may be 70 mm, which is a width of a general-purpose COF tape.

The first wiring pattern 52 is disposed on the flexible substrate 51. In addition, the first input terminal 53 and the first output terminal 54 are disposed adjacent to the pair of sides 51c and 51d, respectively, forming a rectangular shape of the flexible substrate 51. In addition, the first input terminal 53 and the first output terminal 54 are connected to the first wiring pattern 52. The first input terminal 53 and the first output terminal 54 are terminals for connecting the driver unit 41 to an external circuit. The first wiring pattern 52, the first input terminal 53, and the first output terminal 54 may be formed of the same material or may be integrally formed of the same material. Alternatively, the first wiring pattern 52, the first input terminal 53, and the first output terminal 54 may be formed of different materials.

The source driver IC 55 is connected to the first wiring pattern 52, receives a display data signal from the first input terminal 53, and generates an RGB signal for each pixel. The RGB signal serially includes R, G, and B data applied to three sub-pixels forming one pixel. The number of the RGB signals output from the source driver IC 55 for each pixel is, for example, 960 to 1440.

From a viewpoint of a large circuit scale, it is preferable that the source driver IC 55 is formed of a single crystal silicon semiconductor, and it is preferable that the source driver IC 55 is, for example, a bare chip or a packaged IC. The source driver IC 55 is connected to the first wiring pattern 52 by, for example, flip-chip bonding or soldering.

Figure 6:
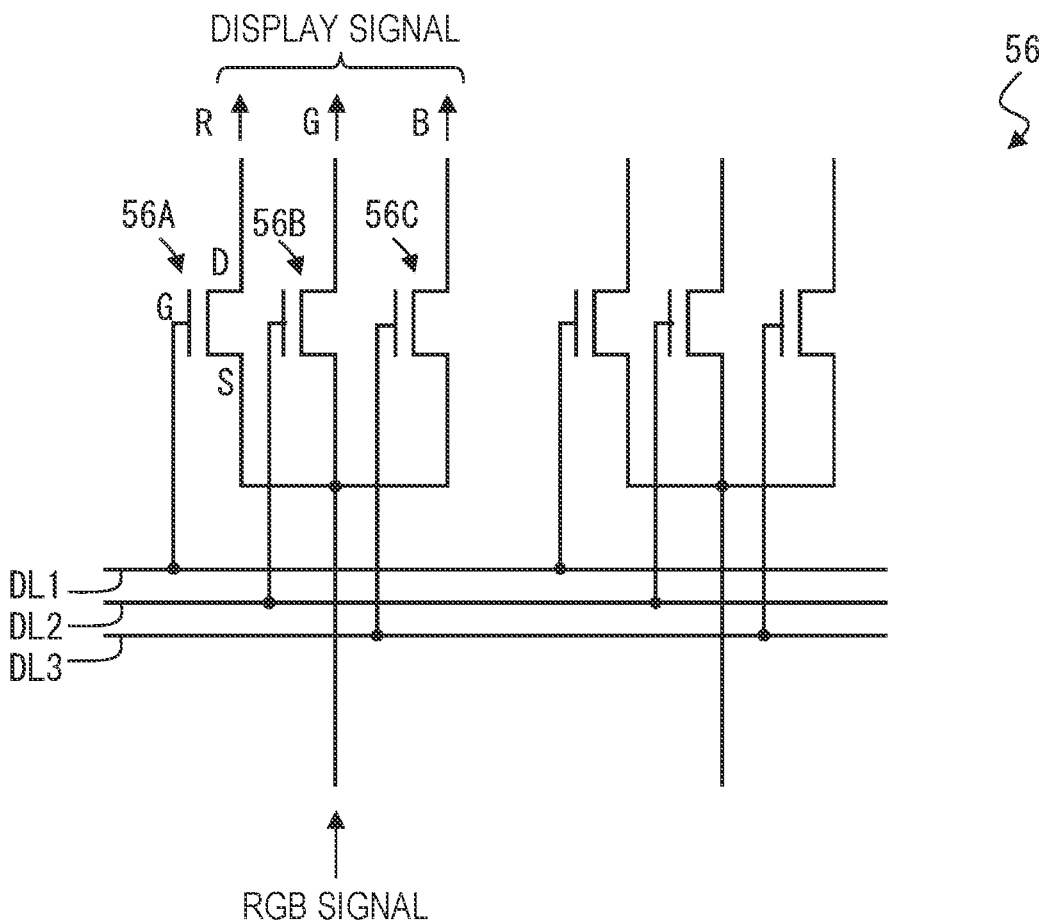
FIG. 6 is a part of a circuit diagram illustrating a configuration example of a demultiplexer circuit.

The demultiplexer circuit 56 is monolithically formed on the flexible substrate 51 and is connected to the first wiring pattern 52. The demultiplexer circuit 56 receives the RGB signal for each pixel output from the source driver IC 55 and generates a display signal to be applied to three RGB sub-pixels. FIG. 6 illustrates a part of a circuit diagram illustrating a configuration example of the demultiplexer circuit 56. The demultiplexer circuit 56 includes a TFT 56A, a TFT 56B, and a TFT 56C for one pixel forming a white color, and for example, RGB signals are applied to sources of the TFTs 56A, 56B, and 56C. Driving lines DL1, DL2, and DL3 are connected to gates of the TFTs 56A, 56B, and 56C. At a timing at which drive signals are applied to the driving lines DL1, DL2, and DL3, the TFTs 56A, 56B, and 56C are turned on, and display signals of R, G, and B are output in parallel from a drain of each TFT.

The demultiplexer circuit 56 is monolithically formed on the flexible substrate 51 and is connected to the first wiring pattern 52. It is preferable that the TFTs including TFTs 56A, 56B, and 56C forming the demultiplexer circuit 56 have the polysilicon. The polysilicon has a characteristic of high electron mobility. Therefore, the TFT having a polysilicon semiconductor layer can be operated at a high speed and has high driving capability. Therefore, the demultiplexer circuit 56 can generate display signals of R, G, and B at a high speed. In addition, a sufficient current can flow to charge the pixel electrode PE. When the TFT of the pixel PX has the amorphous silicon, it is preferable that the TFTs including the TFTs 56A, 56B, and 56C have the polysilicon or the oxide semiconductor.

In addition, the TFT forming the demultiplexer circuit 56 may be formed of the oxide semiconductor having a composition and/or crystallinity different from those of the TFT of the pixel PX. For example, the TFT of the pixel PX may be formed of a low-mobility oxide semiconductor, and the TFT forming the demultiplexer circuit 56 may be formed of a high-mobility oxide semiconductor. More specifically, the TFT of the pixel PX may be formed of the amorphous oxide semiconductor, and the TFT forming the demultiplexer circuit 56 may be formed of a crystalline oxide semiconductor. The amorphous oxide semiconductor can be formed at a low cost. Therefore, when the TFT of the pixel PX having a wide forming region is formed of the amorphous oxide semiconductor, manufacturing costs of the display device can be reduced without reducing a processing speed for the demultiplexer circuit 56.

For example, the control substrate 20 includes a substrate 21, and a timing controller IC 22 and a control substrate terminal 23 which are disposed on the substrate 21. The timing controller IC 22 receives a video signal from an arithmetic device including, for example, a CPU of a device on which the display device 101 is mounted, generates a display data signal, and outputs the display data signal from the control substrate terminal 23. The display data signal is input to the driver unit 41 by connecting the first input terminal 53 of the driver unit 41 to the control substrate terminal 23.

Figure 7:
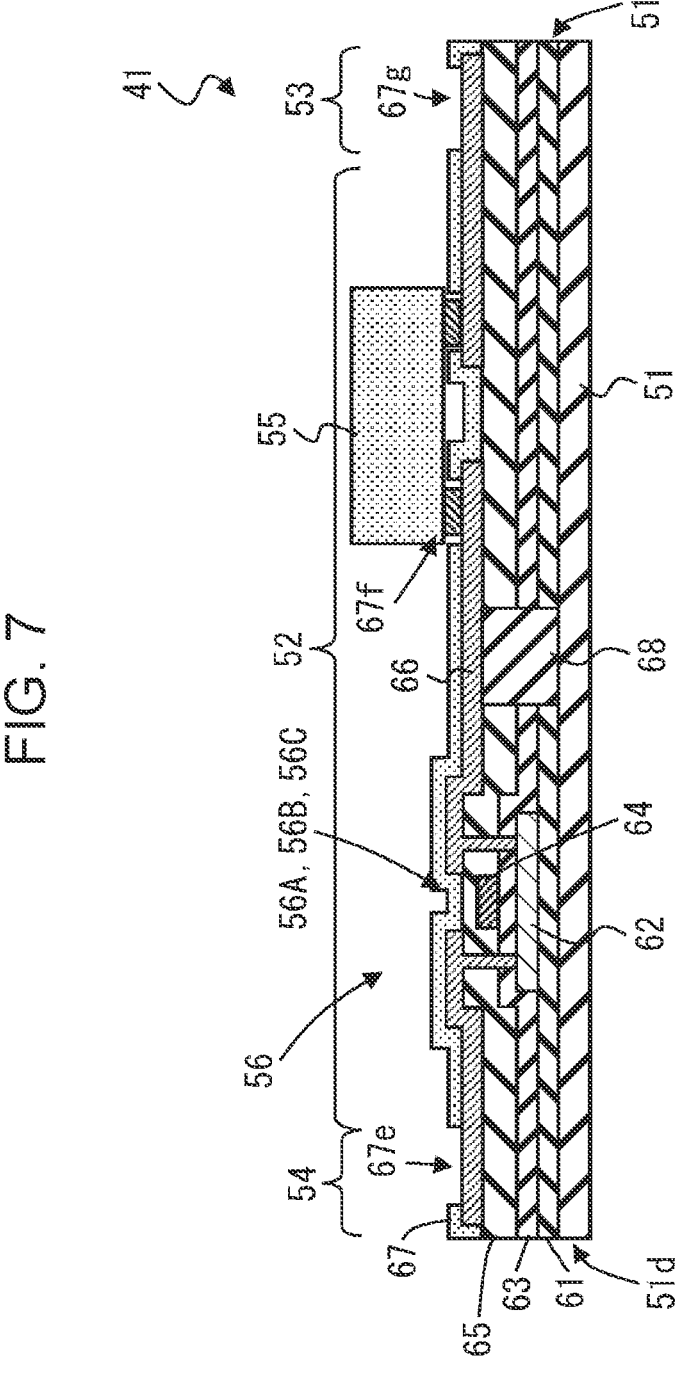
FIG. 7 is a schematic view illustrating an example of a sectional structure of the driver unit.

FIG. 7 is a schematic view illustrating an example of a sectional structure of the driver unit 41. The driver unit 41 can be manufactured on the flexible substrate 51 by using a semiconductor manufacturing technology. For example, the driver unit 41 has a base coat layer 61, a semiconductor layer 62, a gate insulating film 63, a gate electrode 64, an interlayer insulating film 65, a metal layer 66, and a protection film 67.

The base coat layer 61 has insulating properties and is disposed on the flexible substrate 51. The semiconductor layer 62 is disposed on the base coat layer 61.

It is preferable that the semiconductor layer 62 is formed of the polysilicon as described above. As long as the semiconductor layer 62 is formed of the polysilicon, the semiconductor layer 62 can be formed by various forming methods. When the semiconductor layer 62 is directly formed on the flexible substrate 51, the amorphous silicon can be formed on the base coat layer 61, and the amorphous silicon can be polycrystallized by using laser annealing. The polysilicon formed in this way is sometimes referred to as low temperature polysilicon (LTPS). Alternatively, a polysilicon thin film formed on another substrate at a high temperature may adhere onto the base coat layer 61.

The gate insulating film 63 is disposed on the base coat layer 61 by covering the semiconductor layer 62. The gate electrode 64 is disposed on the gate insulating film 63 above the semiconductor layer 62. In addition, the interlayer insulating film 65 is disposed on the gate insulating film 63 by covering the gate electrode 64. The metal layer 66 is disposed on the interlayer insulating film 65. The protection film 67 is disposed on the interlayer insulating film 65 by covering the metal layer 66. Openings 67e, 67f, and 67g are provided in the protection film 67, and the metal layer 66 is exposed through the openings. The opening 67e is close to the side 51d of the flexible substrate 51, and the opening 67g is close to the side 51c.

The metal layer 66 is patterned and connected to the semiconductor layer 62 via contact holes provided in the interlayer insulating film 65 and the gate insulating film 63. In addition, in a form illustrated in FIG. 7, the metal layer 66 integrally forms the first wiring pattern 52, the first input terminal 53, and the first output terminal 54. Specifically, a portion exposed through the opening 67e of the protection film 67 in the metal layer 66 forms the first output terminal 54, and a portion exposed through the opening 67g of the protection film 67 in the metal layer 66 forms the first input terminal 53. In addition, the first wiring pattern 52 is formed between the portions exposed through the openings 67e and 67g in the metal layer 66. A source driver IC 55 is connected to a portion exposed through the opening 67f in the metal layer 66, that is, a part of the first wiring pattern 52.

The gate electrode 64, the gate insulating film 63, and the semiconductor layer 62 form the TFTs such as the TFTs 56A, 56B, and 56C, and a plurality of TFTs form the demultiplexer circuit 56. Since the driver unit 41 has this structure, the driver unit 41 can include a monolithic demultiplexer circuit 56 and a discrete source driver IC 55.

Figure 8A:
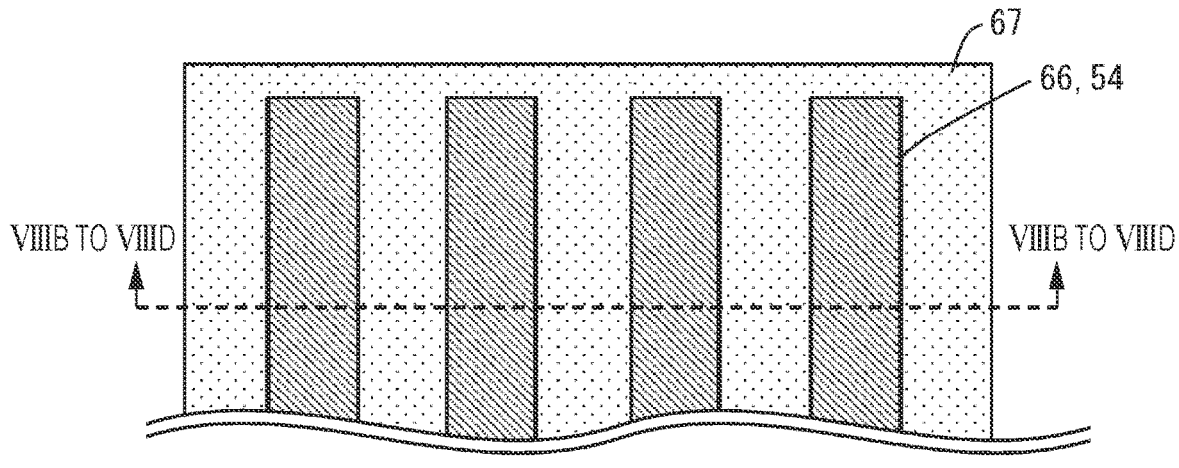
FIG. 8A is a plan view in a vicinity of a first output terminal of the driver unit.
Figure 8B:
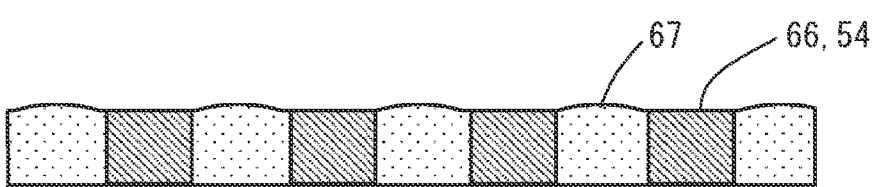
FIG. 8B is a schematic sectional view illustrating a structure of the first output terminal taken along line VIIIB-VIIIB in FIG. 8A.

FIG. 8A is a plan view in the vicinity of the first output terminal 54, and FIG. 8B is a schematic sectional view taken along line VIIIB-VIIIB in FIG. 8A. As described above, the first output terminal 54 is formed by patterning the metal layer 66 into a stripe shape. The protection film 67 is disposed between the first output terminals 54. It is preferable that heights of the first output terminal 54 and the protection film 67 between the first output terminals 54 substantially coincide with each other to enable the first output terminal 54 and the first substrate terminal 13 to be joined by crimping. For example, the protection film 67 having a thickness greater than a thickness of the metal layer 66 may be formed on the interlayer insulating film 65 by covering the metal layer 66, and furthermore, a resist layer may be formed to fill a step difference of the protection film 67. Thereafter, the resist layer and a part of the protection film 67 may be removed by etch-back processing.

Figure 8C:
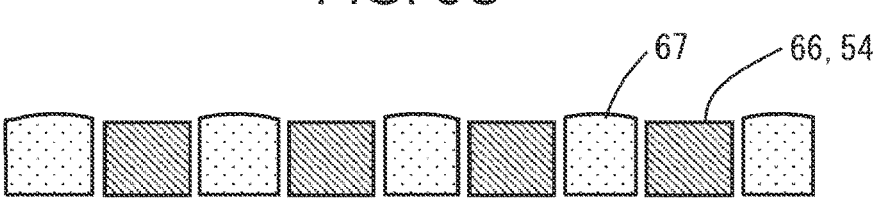
FIG. 8C is a schematic sectional view illustrating another structure of the first output terminal taken along line VIIIC-VIIIC in FIG. 8A.
Figure 8D:
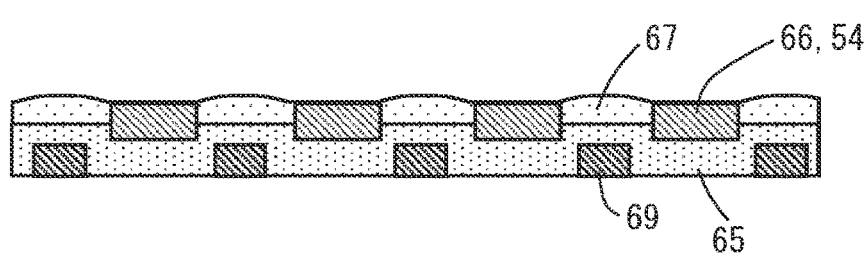
FIG. 8D is a schematic sectional view illustrating another structure of the first output terminal taken along line VIIID-VIIID in FIG. 8A.

As illustrated in FIG. 8C, a gap may be provided between the first output terminals 54 and the protection film 67 between the first output terminals 54. In addition, as illustrated in FIG. 8D, in order to equalize the heights of the first output terminal 54 and the protection film 67 between the first output terminals 54 as much as possible, a spacer layer 69 which can be formed of the same material and in the same process as those of the gate electrode 64 may be disposed between the first output terminals 54. The first input terminal 53 may also be formed to have a similar structure.

Figure 9:
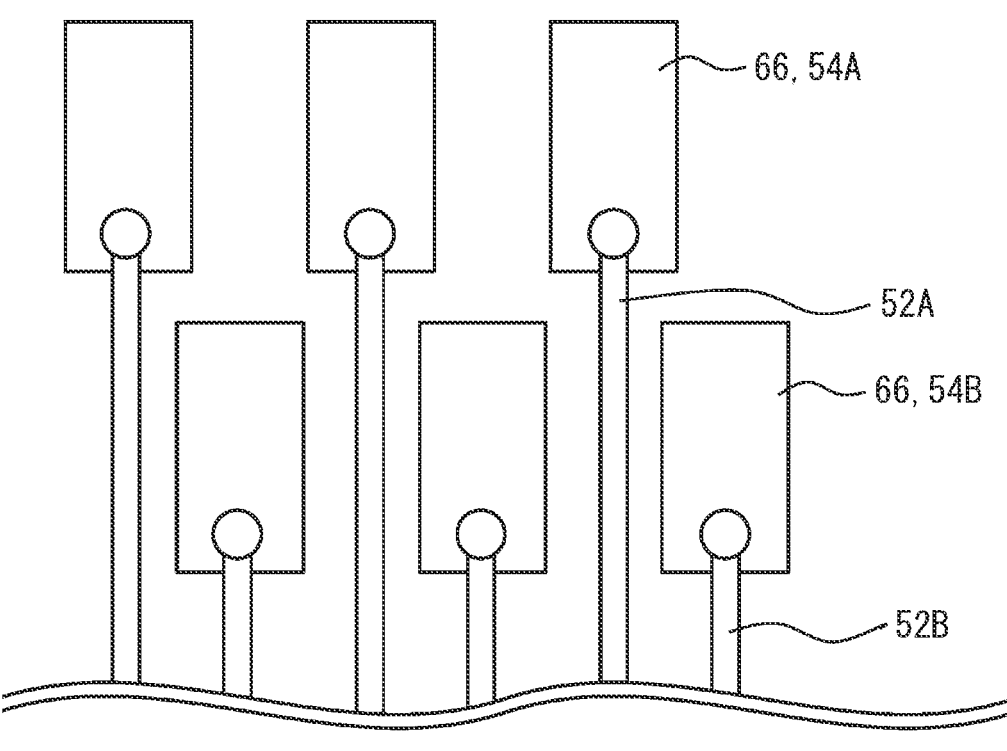
FIG. 9 is a plan view illustrating another structure of the first output terminal of the driver unit.

In addition, a disposition of the first output terminal 54 is not limited to an example illustrated in FIG. 5. As illustrated in FIG. 9, for example, in order to narrow a pitch of the first output terminals 54, the first output terminal 54A and the first output terminal 54B may be disposed in a zigzag pattern in plan view. The first output terminal 54A and the first output terminal 54B can be formed of, for example, the metal layer 66.

In this case, the first wiring pattern 52A connected to the first output terminal 54A and the first wiring pattern 52B connected to the first output terminal 54B may be formed of a material other than the metal layer 66. For example, the first wiring pattern 52A may be formed of the same material and in the same process as those of the gate electrode 64, and the first wiring pattern 52B may be formed of a different material and in a different process from those of the metal layer 66 and the gate electrode 64. Alternatively, the first wiring pattern 52B may be formed of a different material and a different process from those of the metal layer 66 and the gate electrode 64.

The first output terminal 54A and the first wiring pattern 52A, and the first output terminal 54B and the first wiring pattern 52B can be connected by forming respective contact holes in, for example, the interlayer insulating film 65 interposed therebetween. According to this structure, the first wiring pattern 52A and the first wiring pattern 52B can be disposed at different heights, and wiring density can be improved.

Since the driver unit 41 includes the flexible substrate 51 as a support substrate, the driver unit 41 can be disposed in the display device 101 in a bent state, as illustrated in FIG. 2. Specifically, the driver unit 41 may be bent so that the control substrate 20 is located on a back side of the active matrix substrate 10. In this case, in sectional view, high stress can be applied to a portion having a small radius of curvature in the driver unit 41. Therefore, as illustrated in FIG. 7, for example, in a region where the radius of curvature decreases in a usage state, part of the base coat layer 61, the gate insulating film 63, and the interlayer insulating film 65 may be removed and filled with an organic insulating film 68. In this manner, it is possible to reduce a crack in a configuration element formed of an inorganic insulating material having poor flexibility.

According to the display device 101, the demultiplexer circuit 56 is disposed on the flexible substrate 51 of the driver unit 41. Therefore, the TFT of the pixel PX and the TFT of the demultiplexer circuit can be formed of different semiconductors in accordance with desired performances thereof, and a degree of freedom in designing can be ensured. Specifically, according to the display device 101, the TFT for switching the pixels PX is formed of the oxide semiconductor, and a leakage current is small when the TFT is in a turned-off state. Therefore, even when driving of the pixels is stopped during one frame period, reduction in pixel capacity due to the leakage is decreased. Therefore, even when a driving frequency is lowered, flicker caused by the reduced pixel capacity is less likely to occur, and a display device achieving low power consumption can be realized. When the TFT of the pixel PX is formed of the amorphous silicon, a low-cost display device can be realized.

On the other hand, the TFT forming the demultiplexer circuit 56 of the driver unit 41 are formed of the polysilicon having high electron mobility. Therefore, the TFT can be turned on/off at a high speed and with high driving capability. The demultiplexer circuit 56 is formed on the flexible substrate and can be manufactured independently of the active matrix substrate. Therefore, two different semiconductor layers may not be formed when the active matrix substrate is manufactured. Accordingly, a manufacturing process can be shortened, and manufacturing costs can be reduced. In this manner, it is possible to realize a display device which takes advantage of characteristics of two types of semiconductors.

In addition, the driver unit 41 includes the source driver IC 55 and the demultiplexer circuit 56 which are formed on the flexible substrate 51. Therefore, a space for disposing the driver in the active matrix substrate 10 can be omitted, and a non-display region of the active matrix substrate and a frame region of the display panel can be reduced.

Furthermore, the demultiplexer circuit 56 is monolithically formed on the flexible substrate 51. In this manner, the demultiplexer circuit 56 and the first wiring pattern 52 on the flexible substrate 51 may not be connected by soldering or flip-chip bonding. In addition, the number of signals to be output from the source driver IC 55 can be reduced. Therefore, the number of terminals of the source driver IC 55 can be reduced, and locations where the source driver IC 55 and the first wiring pattern 52 are connected by soldering or flip-chip bonding can be reduced.

Furthermore, since the driver unit 41 includes one source driver IC 55 and one demultiplexer circuit 56, the driver unit 41 can be treated as a module corresponding to the source driver IC 55. Therefore, the driver unit 41 is very effective as a general-purpose component supporting a display device having various numbers of pixels.

Second Embodiment

Figure 10:
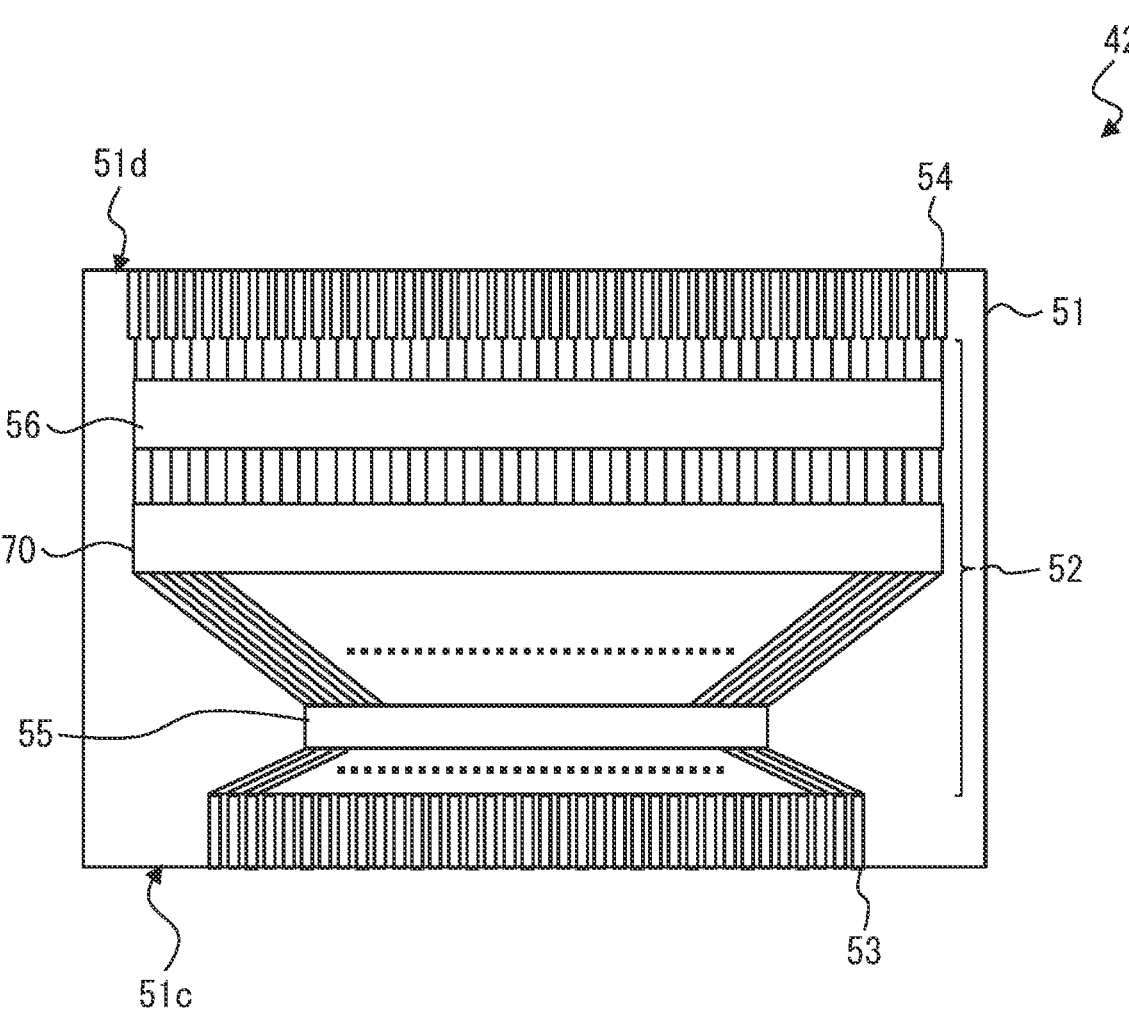
FIG. 10 is a schematic plan view of a driver unit of a display device according to a second embodiment.

FIG. 10 is a schematic plan view of a driver unit 42 of a display device of the present embodiment. The display device of the present embodiment is different from the display device 101 of the first embodiment in that a protection circuit is provided in the driver unit.

For example, the driver unit 42 includes a protection circuit 70 connected to the first wiring pattern 52. The protection circuit 70 is connected between the demultiplexer circuit 56 and the source driver IC 55 in a circuit formed by the first wiring pattern 52. However, the protection circuit 70 may be connected between the first input terminal 53 and the source driver IC 55 in the circuit formed by the first wiring pattern 52, or may be connected between the demultiplexer circuit 56 and the first output terminal 54.

The protection circuit 70 protects the demultiplexer circuit 56 from static electricity and/or an overvoltage. For this purpose, the protection circuit 70 includes a protection element. For example, the protection element is a Zener diode such as a TVS diode, and includes the polysilicon. Similarly to the demultiplexer circuit 56, it is preferable that the protection circuit 70 is monolithically manufactured on the flexible substrate 51.

According to the display device of the present embodiment, the driver unit 42 includes the protection circuit 70. Therefore, for example, when the source driver IC 55 is mounted on the flexible substrate 51, breakdown of the demultiplexer circuit 56 by the static electricity or the overvoltage is avoided.

Third Embodiment

Figure 11:
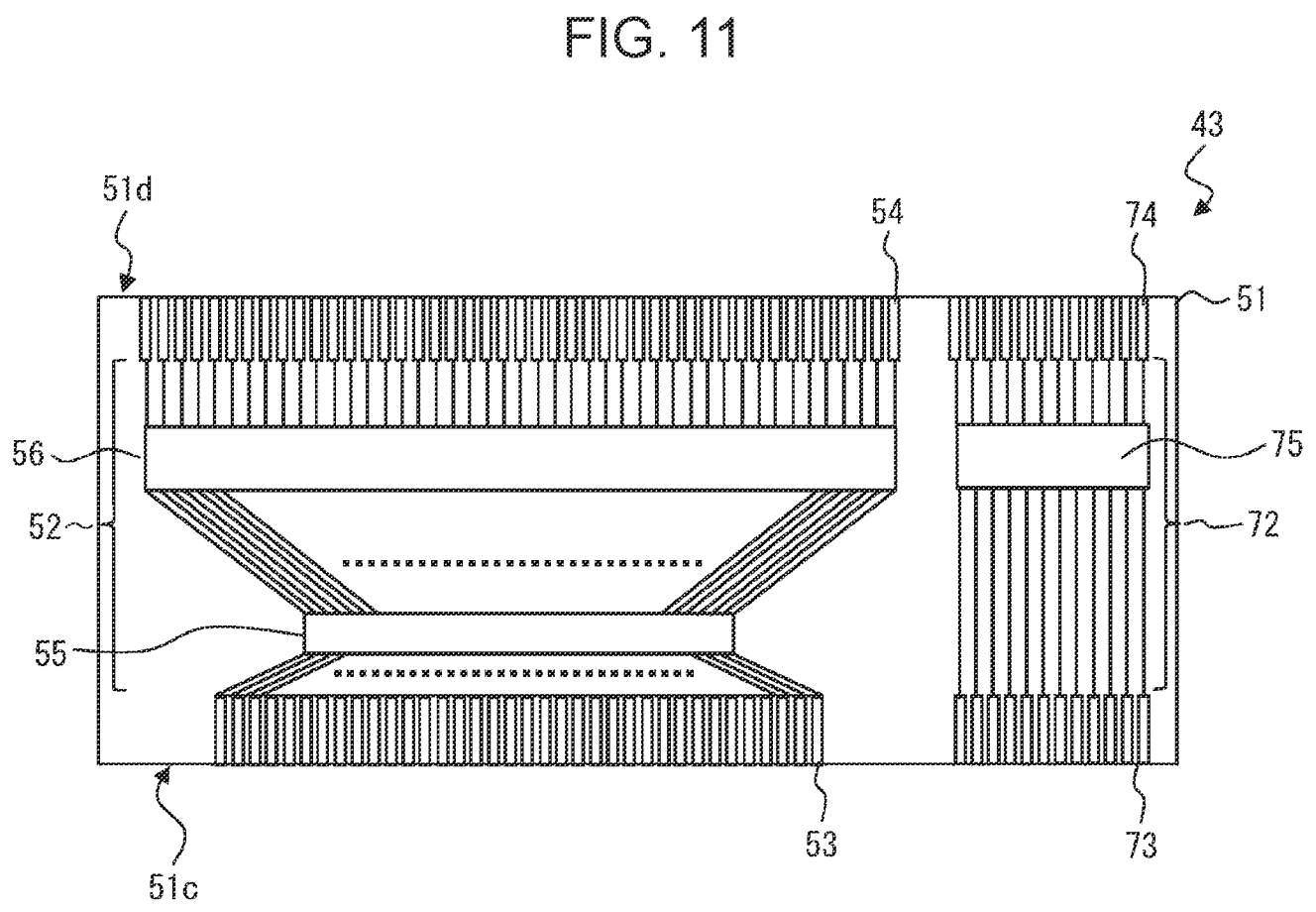

FIG. 11 is a schematic plan view of a driver unit 43 of a display device of the present embodiment. The display device of the present embodiment is different from the driver unit 41 of the display device 101 of the first embodiment in that the driver unit 43 further includes a gate driver.

In addition to the configuration of the driver unit 41 of the first embodiment, the driver unit 43 further includes a second wiring pattern 72, a second input terminal 73, a second output terminal 74, and a gate driver 75.

The second wiring pattern 72 is disposed on the flexible substrate 51. In addition, the second input terminal 73 and the second output terminal 74 are respectively disposed on the sides 51c and 51d of the flexible substrate 51. The second input terminal 73 and the second output terminal 74 are connected to the second wiring pattern 72.

Figure 12:
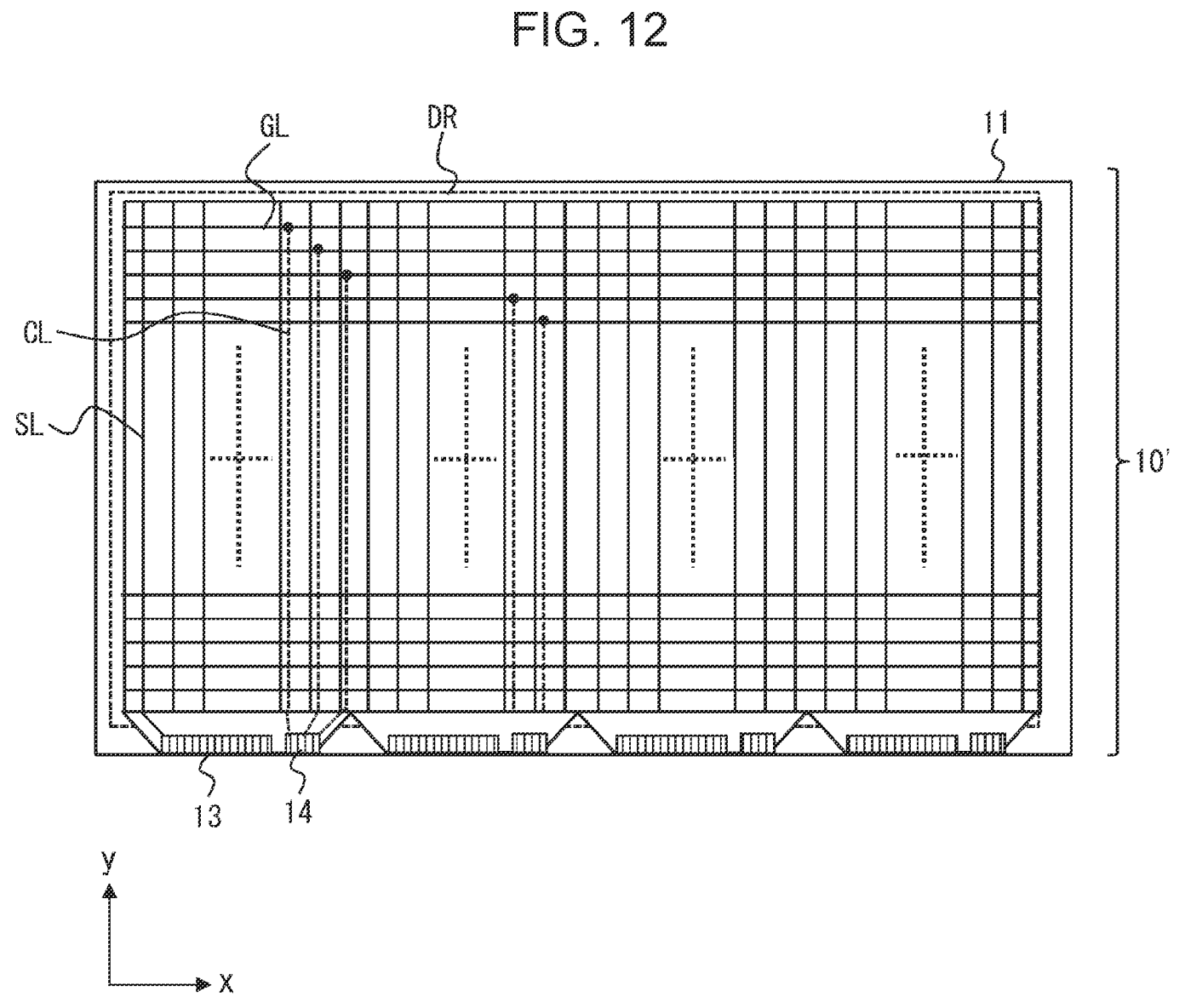

The gate driver 75 is connected to the second wiring pattern 72. The gate driver 75 may be, for example, a bare chip or a packaged IC and may be monolithically formed on the flexible substrate 51 similarly to the demultiplexer circuit 56. As illustrated in FIG. 12, an active matrix substrate 10' of the display device of the present embodiment further includes a plurality of connection lines CL and a second substrate terminal 14, and does not include a gate driver in a non-display region. The plurality of connection lines CL extend parallel to the source bus lines SL, and each of the connection lines CL is connected to one of the gate bus lines GL.

The second substrate terminal 14 is disposed adjacent to the first substrate terminal 13 and is connected to the connection line CL. In addition, the second substrate terminal 14 is connected to the second output terminal 74 of the driver unit 43.

According to the display device of the present embodiment, the gate driver is formed in the driver unit 43. In this manner, the non-display region of the active matrix substrate 10' can be reduced, and the frame region of the display device can be reduced.

Fourth Embodiment

Figure 13:
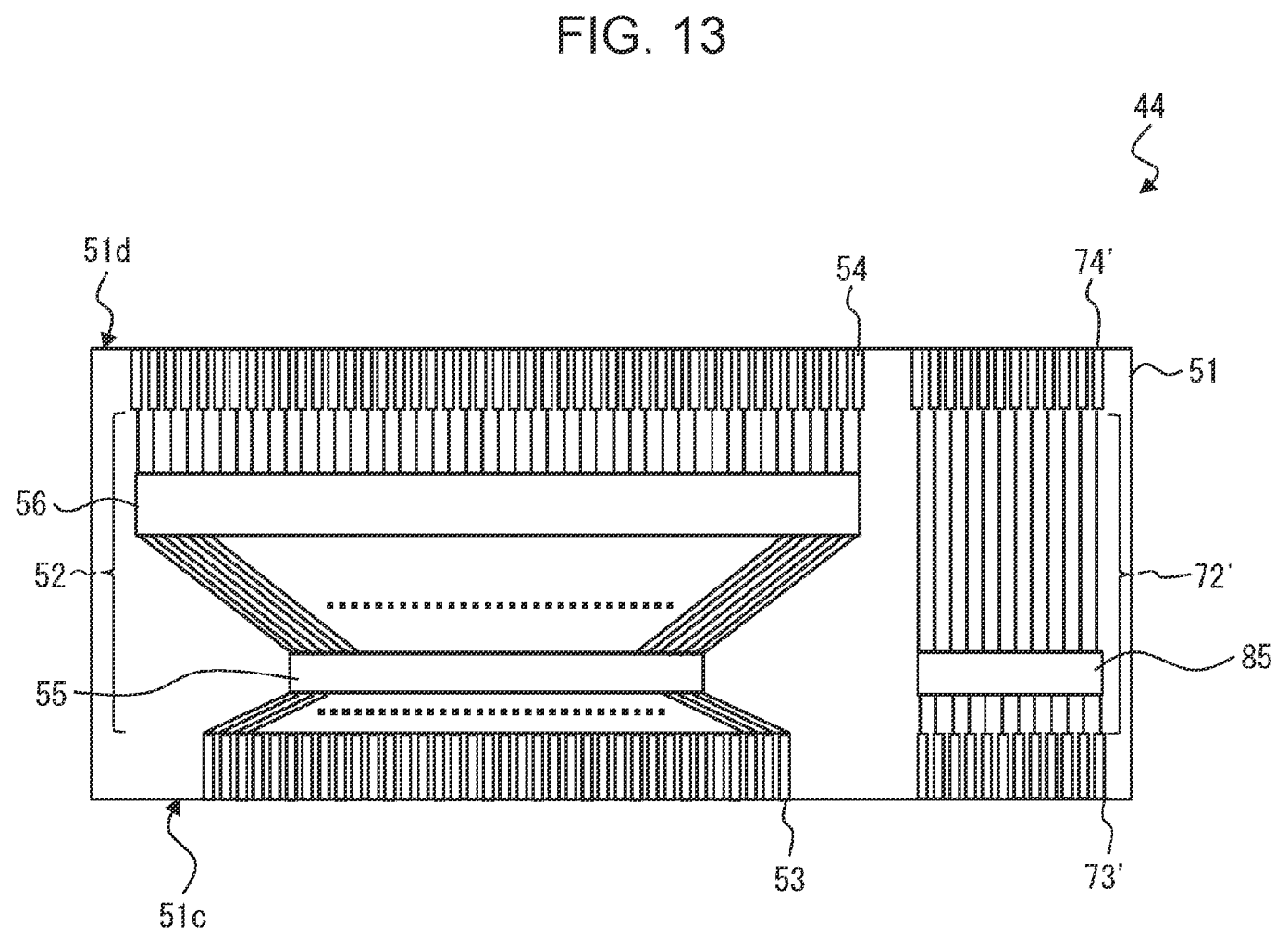

FIG. 13 is a schematic plan view of a driver unit 44 of a display device of the present embodiment. The display device of the present embodiment is an in-cell touch panel type display device. The display device of the present embodiment is different from the driver unit 41 of the display device 101 of the first embodiment in that the active matrix substrate includes an in-cell touch panel and the driver unit 44 further includes a touch panel driver.

In addition to the configuration of the driver unit 41 of the first embodiment, the driver unit 44 further includes a second wiring pattern 72', a second input terminal 73', a second output terminal 74', and a touch panel controller IC 85.

The second wiring pattern 72' is disposed on the flexible substrate 51. The second input terminal 73' and the second output terminal 74' are respectively disposed on the sides 51c and 51d of the flexible substrate 51. The second input terminal 73' and the second output terminal 74' are connected to the second wiring pattern 72'.

The touch panel controller IC 85 is connected to the second wiring pattern 72'. The touch panel controller IC 85 is, for example, a bare chip or a packaged IC, and is connected to the second wiring pattern 72' by, for example, flip-chip bonding or soldering. The touch panel controller IC 85 is suitable for in-cell touch panel. In the second output terminal 74', an active matrix substrate (not illustrated) is connected to a terminal connected to wiring of the in-cell touch panel.

Figure 14:
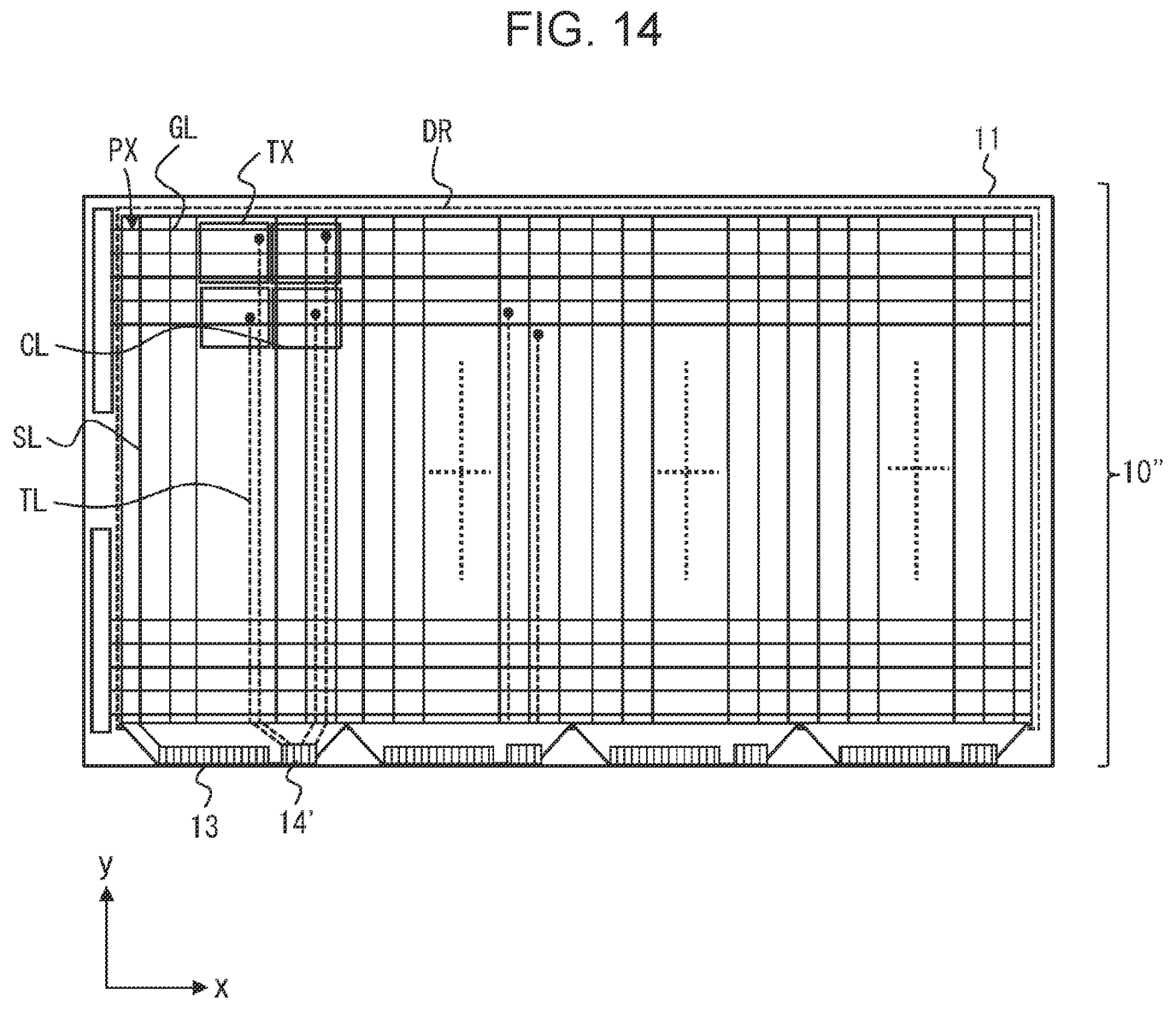

In FIG. 14, an active matrix substrate 10" of the present embodiment includes touch panels TP respectively disposed on the substrate 11 and disposed to overlap the plurality of pixels PX, and the second substrate terminal 14' connected to the touch panel TP.

For example, the touch panel TP is a self-capacitance type, and includes a plurality of touch sensor electrodes TX and a plurality of touch wires TL. For example, each of the touch sensor electrodes TX is disposed across the plurality of pixels PX, and the plurality of touch sensor electrodes TX are disposed in a two dimensional manner in the x-direction and the y-direction. The touch sensor electrode TX may also serve as a common electrode of the display device.

The touch wire TL extends in the y-direction, one end is connected to the touch sensor electrode TX, and the other end is connected to the second substrate terminal 14'. The second substrate terminal 14' is disposed adjacent to the first substrate terminal 13. In addition, the second substrate terminal 14 is connected to the second output terminal 74' of the driver unit 43.

According to the display device of the present embodiment, the touch panel controller IC 85 is formed in the driver unit 43. In this manner, a flexible substrate for connecting the touch panel controller IC 85 to the active matrix substrate 10' is not provided. Therefore, the number of components can be reduced, and a manufacturing process can be shortened.

Figure 15:
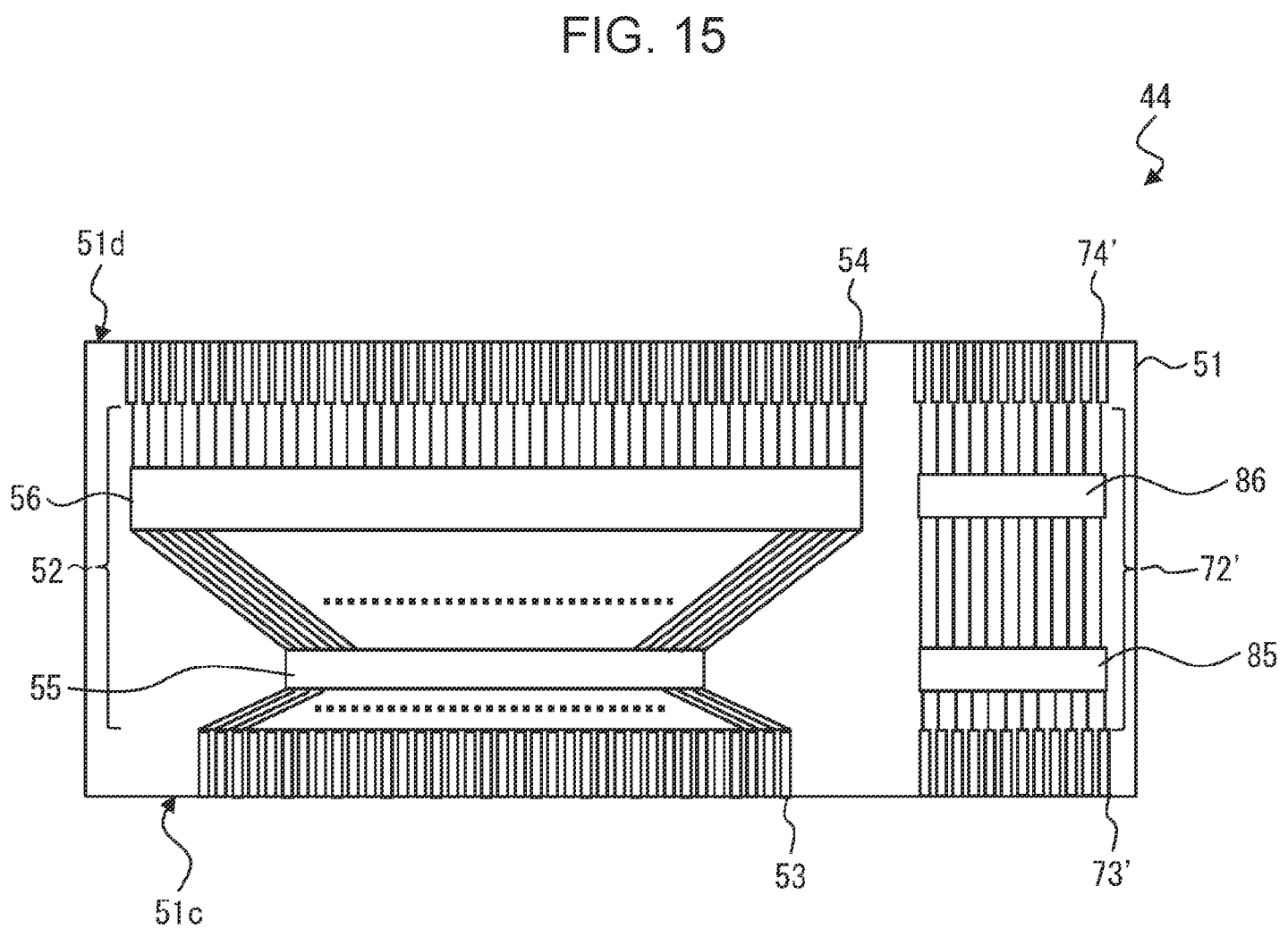

As illustrated in FIG. 15, in the display device of the present embodiment, the driver unit 44 may further include a demultiplexer circuit 86 for a touch panel. For example, the demultiplexer circuit 86 receives one drive signal, and applies the drive signal sequentially to a plurality of drive electrodes. It is preferable that the demultiplexer circuit 86 is monolithically formed on the flexible substrate 51. In addition, it is preferable that the demultiplexer circuit 86 is formed of the TFT containing the polysilicon.

Since the demultiplexer circuit 86 is provided, the number of terminals for outputting signals from the touch panel controller IC 85 can be reduced.

Fifth Embodiment

Figure 16:
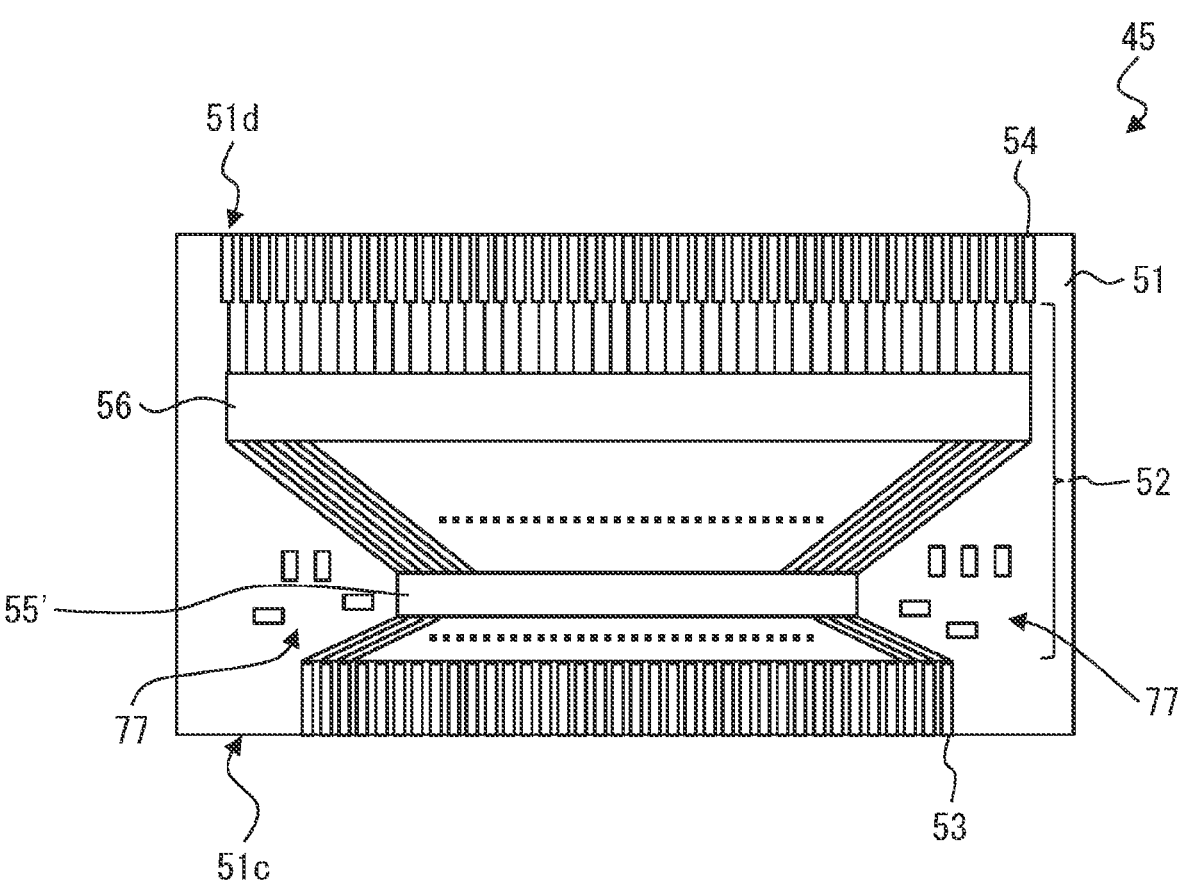
FIG. 16 is a schematic plan view of a driver unit of a display device according to a fifth embodiment.

FIG. 16 is a schematic plan view of a driver unit 45 of a display device of the present embodiment. The display device of the present embodiment is different from the driver unit 41 of the display device 101 of the first embodiment in that the driver unit 45 further includes a CR circuit 77 and the source driver IC includes a power supply circuit.

For example, a source driver IC 55' includes a power supply circuit such as the source bus lines SL, the gate bus lines GL, and a counter electrode for generating signals to be applied to the active matrix substrate 10. The CR circuit 77 is connected to the first wiring pattern 52, and is connected to the power supply circuit of the source driver IC 55' via the first wiring pattern 52. The CR circuit 77 includes passive elements such as a resistor and a capacitor, and is disposed close to the source driver IC 55'.

The source driver IC 55' includes the power supply circuit, and the CR circuit 77 is disposed close to the source driver IC 55'. In this manner, parasitic capacitance that may occur between the CR circuit 77 and the power supply circuit of the source driver IC 55' can be reduced, and an operation of the power supply circuit can be stabilized.

Sixth Embodiment

Figure 17:
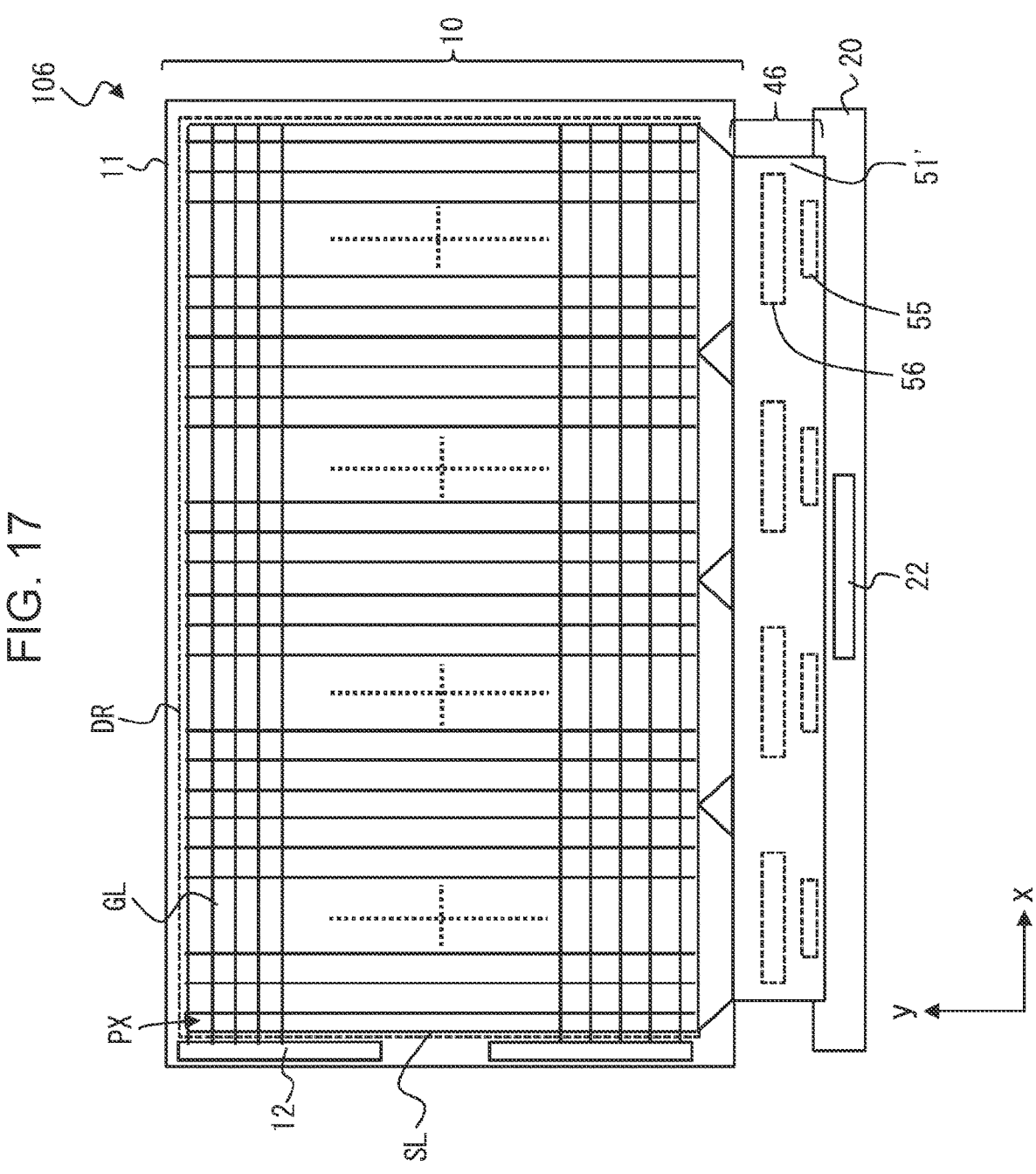
FIG. 17 is a schematic plan view illustrating a major configuration of a display device according to a sixth embodiment.

FIG. 17 is a schematic plan view illustrating a major configuration of a display device 106 of the present embodiment. The display device of the present embodiment is different from the display device 101 of the first embodiment in that a driver unit 46 includes a plurality of source driver ICs and a plurality of demultiplexer circuits 56 disposed in one flexible substrate 51'. In an example illustrated in FIG. 17, in the driver unit 46, four source driver ICs 55 are mounted on one flexible substrate 51'. However, the number of the source driver ICs to be mounted may be selected in any way as long as the number is two or more. For example, the flexible substrate 51' has a width substantially equal to a horizontal width of the display region DR of the active matrix substrate 10.

In the present embodiment, the driver unit 46 includes four independent demultiplexer circuits 56 corresponding to the number of source driver ICs 55. However, the driver unit 46 may include demultiplexer circuits whose number is smaller than the number of the source driver ICs 55.

According to the display device of the present embodiment, the number of the driver units 46 to be connected is reduced. Therefore, the number of components can be reduced, and a mounting process can be reduced.

Figure 18:
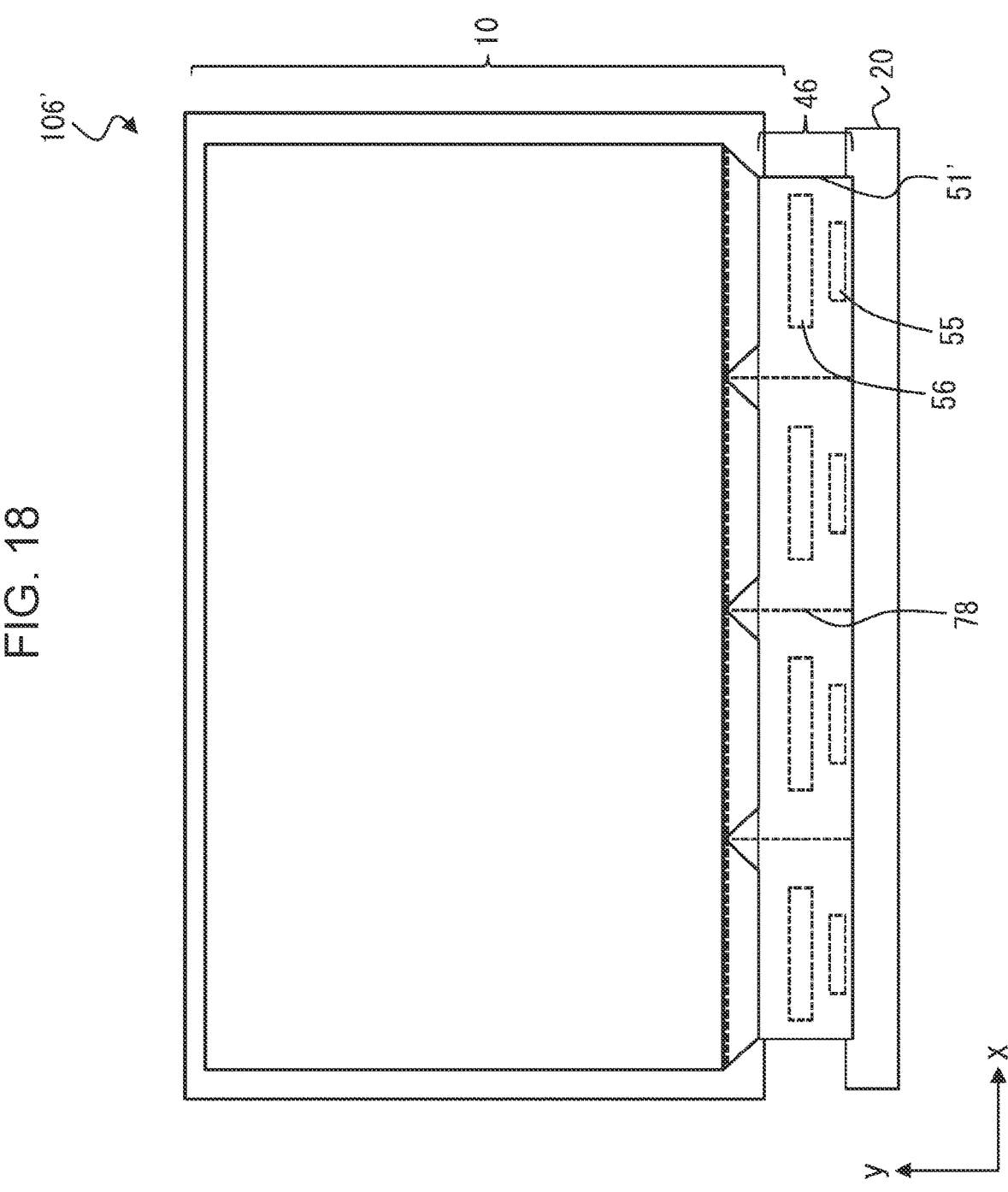
FIG. 18 is a schematic plan view illustrating a major configuration of the display device according to the sixth embodiment.

In addition, since the width of the flexible substrate 51' is widened, a space for mounting other wiring or components for driving the display panel increases. Therefore, a degree of freedom in designing the display device can be improved. For example, when the display device includes an organic EL panel, the disposition of wiring for applying voltage to a light emitting layer plays a certain role. As illustrated in FIG. 18, according to a display device 106', wiring 78 for applying the voltage to the light emitting layer can be relatively freely disposed in the wide flexible substrate 51'. Therefore, for example, resistance of the wiring 78 can be reduced by designing a position of the wiring 78 so that the length of the wiring 78 is as short as possible.

Seventh Embodiment

Figure 19:
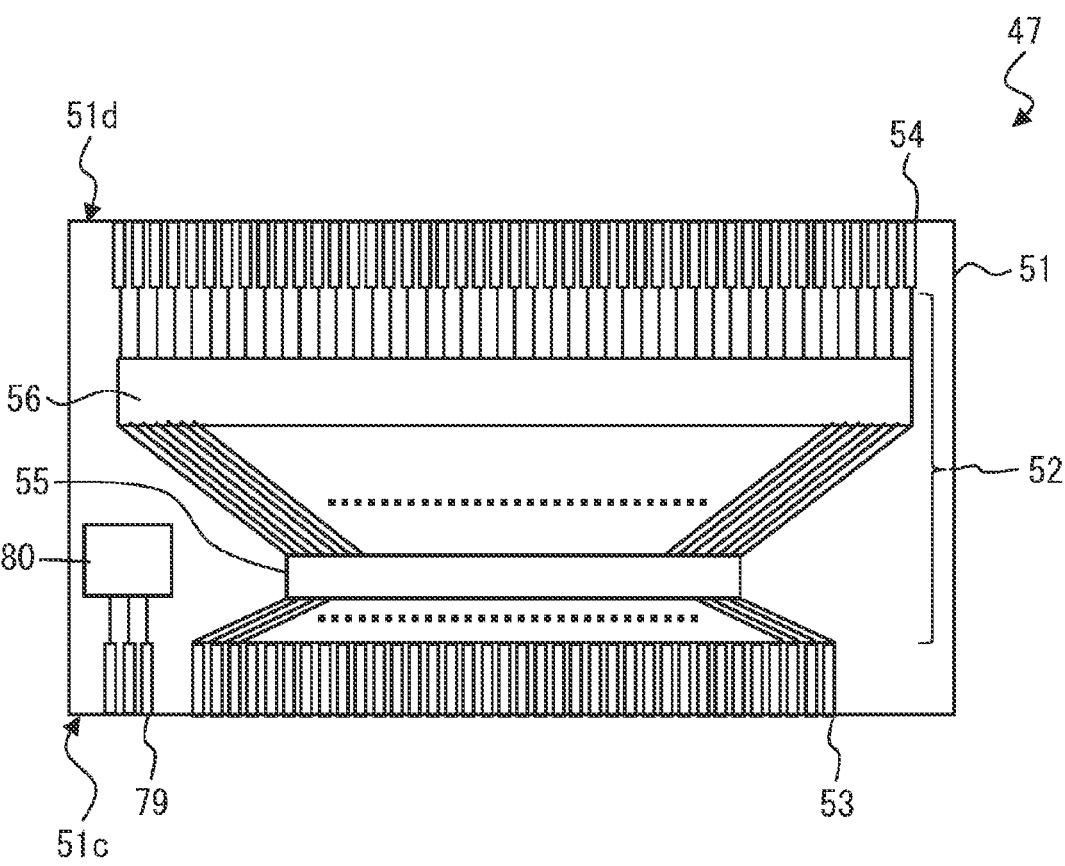
FIG. 19 is a schematic plan view of a driver unit of a display device according to a seventh embodiment.

FIG. 19 is a schematic plan view of a driver unit 47 of a display device of the present embodiment. The display device of the present embodiment is different from the driver unit 41 of the display device 101 of the first embodiment in that the driver unit 47 further includes an input/output terminal 79 and a sensor circuit 80.

For example, the input/output terminal 79 is disposed close to the side 51c of the flexible substrate 51. The sensor circuit 80 includes at least one sensor element, is disposed on the flexible substrate 51, and is connected to the input/output terminal 79.

For example, the sensor element is a temperature sensor or a photodiode. The sensor circuit 80 may be monolithically formed on the flexible substrate 51, may be a bare chip or a packaged IC, or may be mounted on the flexible substrate 51 by, for example, soldering or flip-chip bonding.

According to the display device of the present embodiment, the driver unit 47 includes the sensor circuit 80. Therefore, a sensor circuit may not be separately mounted. Accordingly, the number of components can be reduced, and a mounting process can be reduced.

Eighth Embodiment

Figure 20:
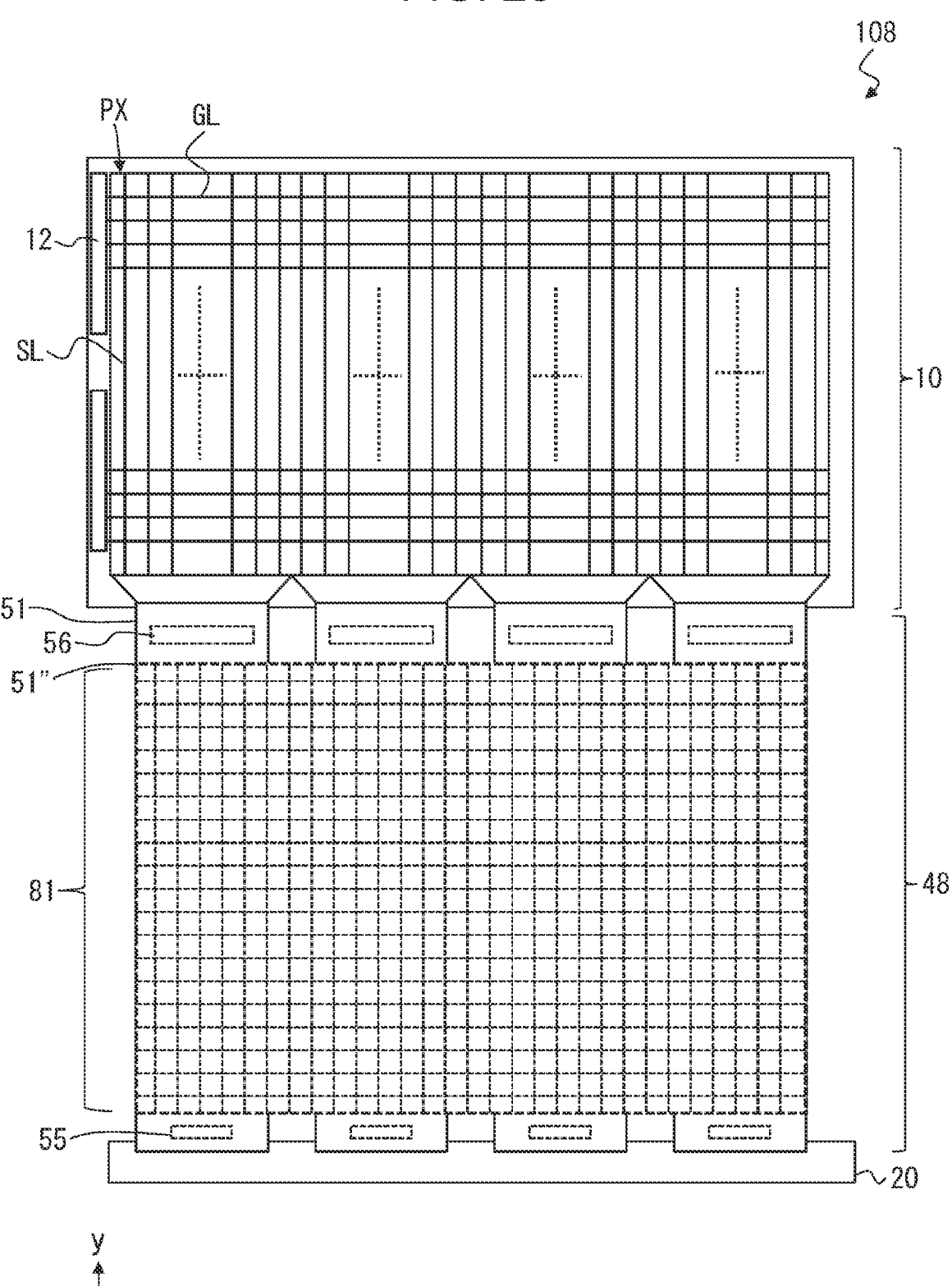
FIG. 20 is a schematic plan view illustrating a major configuration of a display device according to an eighth embodiment.
Figure 21:
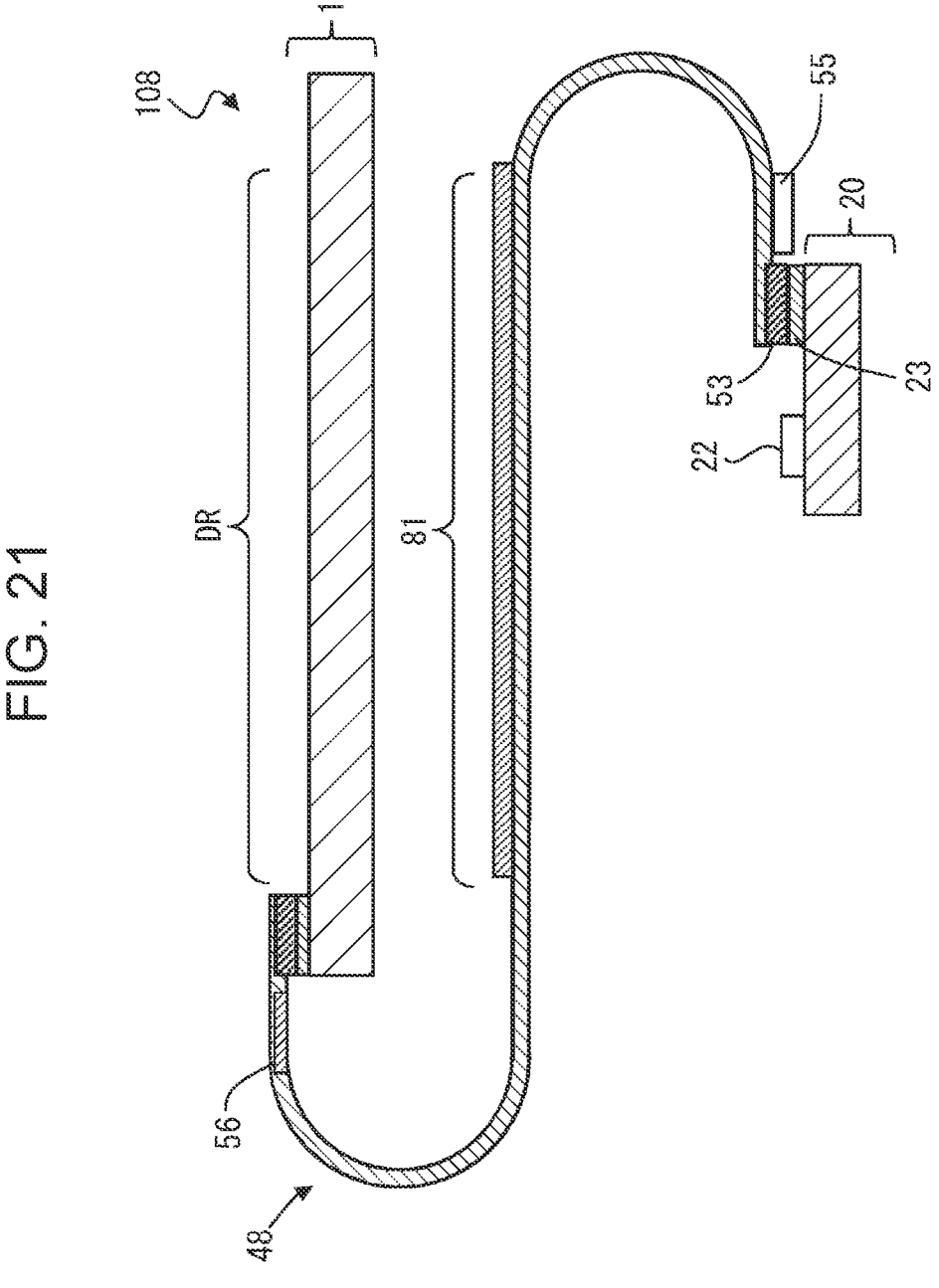
FIG. 21 is a schematic sectional view illustrating the major configuration of the display device according to the eighth embodiment.

FIGS. 20 and 21 are a schematic plan view and a sectional view which illustrate a major configuration of a display device 108 of the present embodiment. The display device of the present embodiment is different from the display device 101 of the first embodiment in that the driver unit 48 includes a matrix-shaped sensor circuit 81.

For example, the matrix-shaped sensor circuit 81 is a touch panel circuit, a fingerprint sensor circuit, or a pressure sensor circuit. For example, the sensor circuit 81 may be a capacitance type touch panel that includes a plurality of wires extending in the x-direction and a plurality of wires extending in the y-direction which are disposed on the flexible substrate 82, and that detects xy-coordinates from changes in capacitance. In addition, the sensor circuit 81 may include a structure in which pressure detection elements and the like are disposed in a two dimensional manner in the x-direction and the y-direction. For example, the driver unit 48 includes a flexible substrate 51" in which a space is provided between the demultiplexer circuit 56 and the source driver IC 55. The sensor circuit 81 is disposed between the demultiplexer circuit 56 and the source driver IC 55 on the flexible substrate 51".

As illustrated in FIG. 20, since the flexible substrate 51" is bent and disposed, the sensor circuit 81 can be disposed to overlap the display region DR of the active matrix substrate 10 in plan view. In this manner, a fingerprint pattern can be detected, or a contact pressure of a finger can be detected by pressing the finger against the display panel.

According to the display device of the present embodiment, the driver unit 48 includes the sensor circuit 81. Therefore, a sensor circuit may not be separately provided. Accordingly, the number of components can be reduced, and a mounting process can be reduced.

Ninth Embodiment

An active matrix device of the present embodiment is a sensor device such as a fingerprint sensor. As described above, when the active matrix device is the input device, as resolution of the sensor is improved, more detection wires are disposed on the active matrix substrate serving as the sensor. Therefore, detection signals output from a plurality of detection wires are multiplexed by a multiplexer circuit, and the number of terminals of a detection IC to be connected to the active matrix substrate is reduced, compared to the number of detection wires.

Figure 22:
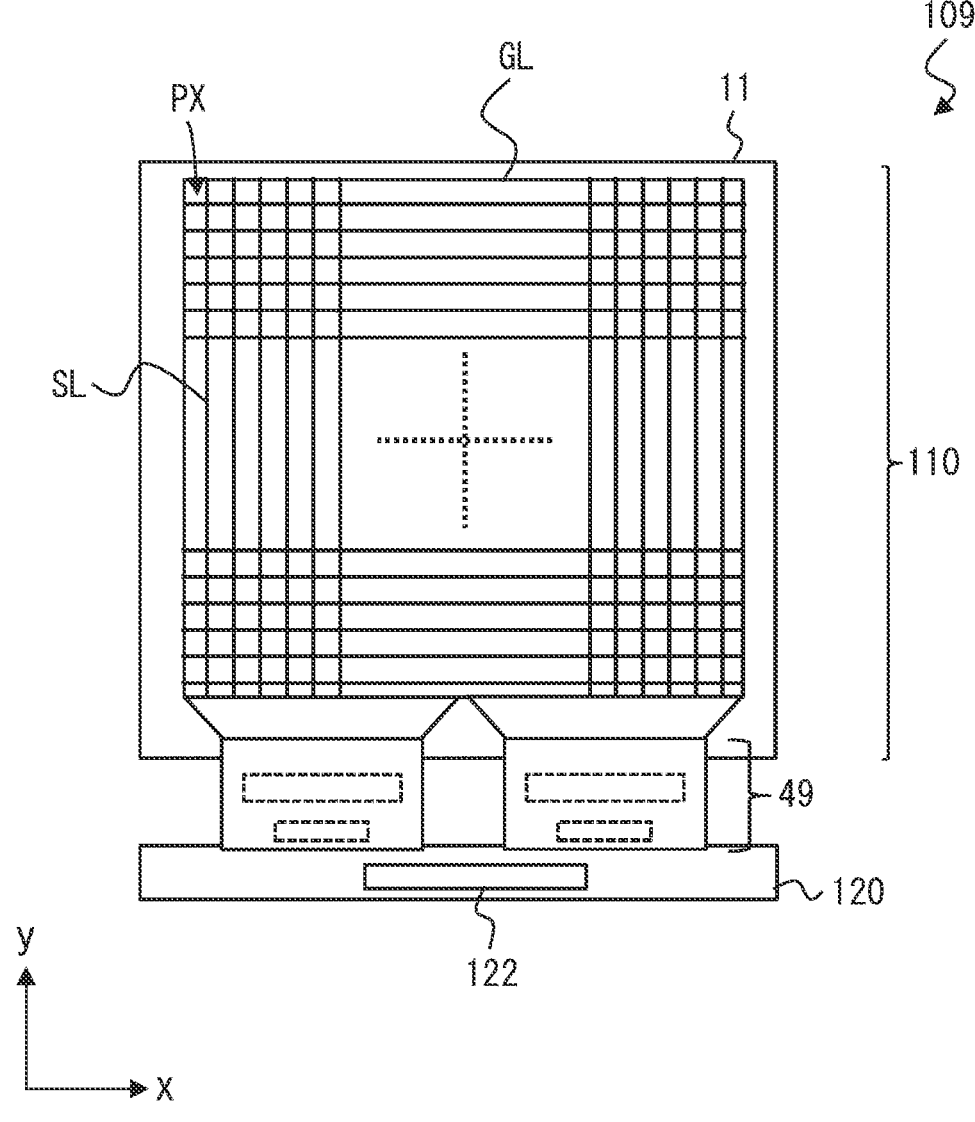
FIG. 22 is a schematic plan view illustrating a major configuration of a sensor device according to a ninth embodiment.

FIG. 22 is a schematic plan view illustrating a major configuration of a sensor device 109 of the present embodiment. The sensor device 109 includes an active matrix substrate 110, a driver unit 49 and a control substrate 120. The active matrix substrate 110 and a counter substrate form a sensor panel.

The active matrix substrate 110 includes the substrate 11, the plurality of gate bus lines GL, the plurality of source bus lines SL, and the plurality of pixels PX. Each of the pixels PX includes the pixel electrode PE and the switch element SW as described in the first embodiment with reference to FIG. 3. The switch element SW is the TFT. A gate G of the TFT is connected to the gate bus line GL, and a source S is connected to the source bus line SL. A drain D is connected to the pixel electrode PE.

For example, from a viewpoint that the active matrix substrate 110 can be manufactured at a low cost, it is preferable that the TFT has the amorphous silicon. As described in the first embodiment, a semiconductor material of the TFT of the pixel PX may be selected from another viewpoint.

In the present embodiment, the pixel electrode PE is a sensor electrode that detects capacitance by a self-capacitance method. When a finger is brought into contact with the sensor device 109, the pixel electrode PE detects a change in capacitance which is caused by unevenness of a fingerprint of the finger in contact. As in FIG. 4, the first substrate terminal 13 is disposed in one end of the source bus line SL. The first substrate terminal 13 is electrically connected to the driver unit 49 as will be described later.

Figure 23:
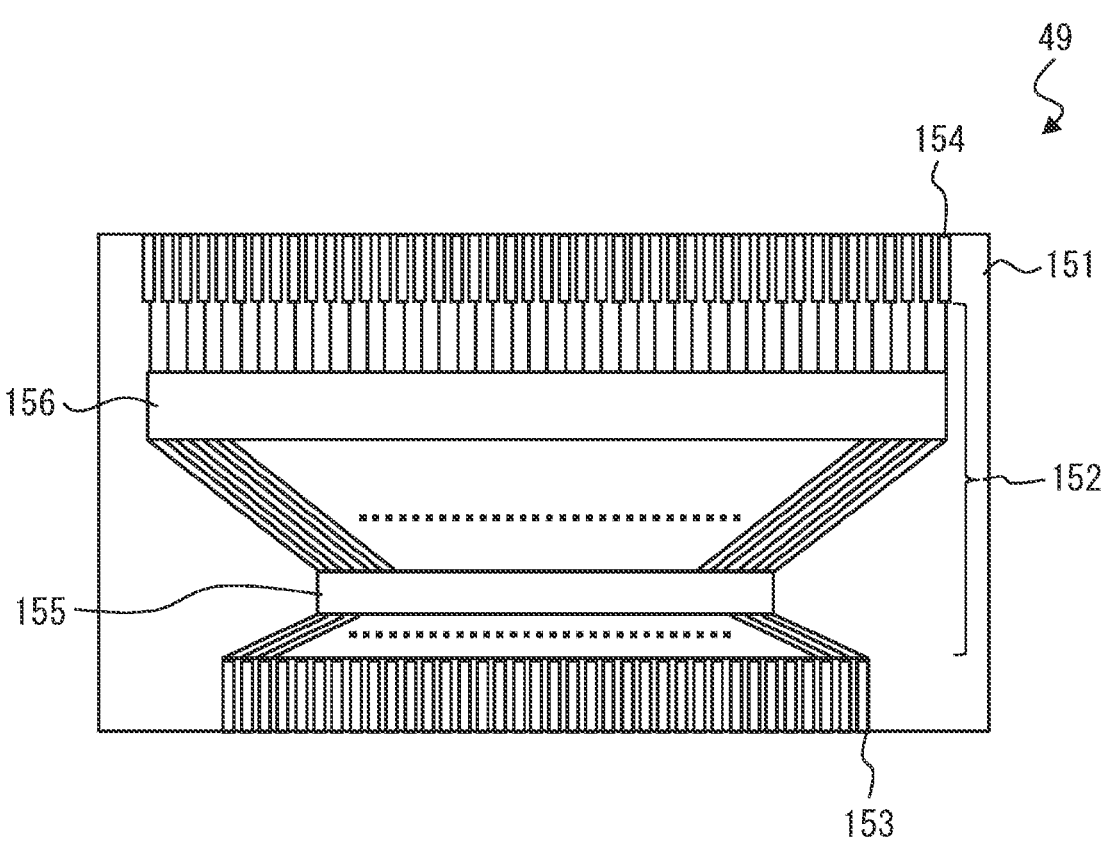
FIG. 23 is a schematic plan view of a driver unit according to the ninth embodiment.

FIG. 23 is a schematic plan view of the driver unit 49. The driver unit 49 includes a flexible substrate 151, a first wiring pattern 152, a first input terminal 153, a first output terminal 154, a detection IC 155, and a multiplexer circuit 156.

The first wiring pattern 152 is disposed on the flexible substrate 151. The first input terminal 153 and the first output terminal 154 are disposed on the flexible substrate 151. The first input terminal 153 and the first output terminal 154 are connected to the first wiring pattern 152. The detection IC 155 is connected to the first wiring pattern 152.

As in the first embodiment, the multiplexer circuit 156 is monolithically formed on the flexible substrate 151. For example, it is preferable that the TFT forming the multiplexer circuit 156 connected to the first wiring pattern 152 has the oxide semiconductor or the polysilicon. As described in the first embodiment, a semiconductor material of the TFT forming the multiplexer circuit 156 may be selected from another viewpoint.

The control substrate 120 includes a sensor controller IC 122, and is connected to the first input terminal 153 of the flexible substrate 151.

According to the present embodiment, the TFT of the pixel PX is formed of the amorphous silicon, and the TFT of the multiplexer circuit 156 is formed of the polysilicon or the oxide semiconductor. In this manner, manufacturing costs can be reduced, and the sensor device 109 which enables high-speed detection can be realized. In addition, as in the first embodiment, the multiplexer circuit 156 is monolithically formed on the flexible substrate 151. In this manner, the multiplexer circuit 156 and the first wiring pattern 152 of the flexible substrate 151 may not be connected by soldering or flip-chip bonding. In addition, the detection signal is multiplexed by the multiplexer circuit 156. Therefore, the number of terminals of the detection IC 155 can be reduced, and the number of locations where the detection IC 155 and the first wiring pattern 152 are connected by soldering or flip-chip bonding can be reduced.

Other Embodiments

The active matrix device of the present disclosure is not limited to the above-described embodiments. Various modifications may be made for the display device described in each of the above-described embodiments. In addition, the display device of the present disclosure may be implemented by combining the above-described embodiments with each other.

The active matrix device of the present disclosure can also be described as follows.

An active matrix device according to a first configuration includes an active matrix substrate including a substrate, a plurality of pixels disposed on the substrate, a plurality of source bus lines connected to the plurality of pixels, and a first substrate terminal disposed on the substrate and connected to each of the plurality of source bus lines, and a driver unit. The driver unit includes a flexible substrate, a first wiring pattern disposed on the flexible substrate, a demultiplexer circuit or a multiplexer circuit supported by the flexible substrate and connected to the first wiring pattern, a source driver IC disposed on the flexible substrate and connected to the first wiring pattern, and a first output terminal disposed on the flexible substrate and connected to the first wiring pattern. The first output terminal is connected to the first substrate terminal. The plurality of pixels and the demultiplexer circuit or the multiplexer circuit each include a TFT. The TFT of the plurality of pixels and the TFT of the demultiplexer circuit or the multiplexer circuit have semiconductors different from each other.

According to the first configuration, the demultiplexer circuit is disposed on the flexible substrate of the driver unit. Therefore, the TFT of the pixel and the TFT of the demultiplexer circuit can be formed of the different semiconductors in accordance with desired performances thereof, and a degree of freedom in designing can be ensured.

In the active matrix device according to a second configuration, in the first configuration, the TFT of the plurality of pixels may have an oxide semiconductor, and the TFT of the demultiplexer circuit or the multiplexer circuit may have polysilicon.

According to the second configuration, the TFT for switching the pixels is formed of the oxide semiconductor. Therefore, a display device achieving low power consumption can be realized. In addition, the TFT forming the demultiplexer circuit of the driver unit is formed of the polysilicon. Therefore, display signals can be processed at a high speed and with high driving capability. Therefore, two different semiconductor layers may not be formed when the active matrix substrate is manufactured. Accordingly, a manufacturing process can be shortened, and manufacturing costs can be reduced. In this manner, it is possible to realize an active matrix device which takes advantage of characteristics of two types of semiconductors.

In the active matrix device according to a third configuration, in the first configuration, the TFT of the plurality of pixels may have amorphous silicon, and the TFT of the demultiplexer circuit or the multiplexer circuit may have an oxide semiconductor or polysilicon. In this manner, an active matrix device that can be operated at a high speed while reducing manufacturing costs can be realized.

In the active matrix device according to a fourth configuration, in the first configuration, the TFT of the plurality of pixels may have an amorphous oxide semiconductor, and the TFT of the demultiplexer circuit or the multiplexer circuit may have a crystalline oxide semiconductor. In this manner, an active matrix device that can be operated at a high speed while reducing manufacturing costs can be realized.

In the active matrix device according to a fifth configuration, in the first configuration, the driver unit may further include a protection circuit disposed on the flexible substrate and connected to the first wiring pattern, and the protection circuit may have a protection element and may protect the demultiplexer circuit or the multiplexer circuit from static electricity and/or an overvoltage.

In the active matrix device according to a sixth configuration, in the first configuration, the active matrix substrate may further include a plurality of gate bus lines connected to the plurality of pixels, a plurality of connection lines connected to the plurality of gate bus lines and extending parallel to the plurality of source bus lines, and a second substrate terminal located on the substrate and connected to each of the plurality of connection lines. The driver unit may include a second wiring pattern disposed on the flexible substrate, a gate driver disposed on the flexible substrate and connected to the second wiring pattern, and a second output terminal disposed on the flexible substrate and connected to the second wiring pattern. The second substrate terminal may be connected to the second output terminal.

In the active matrix device according to a seventh configuration, in the first configuration, the active matrix substrate may further include a touch panel disposed to overlap the plurality of pixels, and a second substrate terminal disposed on the substrate and connected to the touch panel. The driver unit may include a second wiring pattern disposed on the flexible substrate, a touch panel controller IC supported by the flexible substrate and connected to the second wiring pattern, and a second output terminal disposed on the flexible substrate and connected to the second wiring pattern. The second substrate terminal may be connected to the second output terminal.

In the active matrix device according to an eighth configuration, in the sixth configuration, the driver unit may further include another demultiplexer circuit or another multiplexer circuit connected to the second wiring pattern.

In the active matrix device according to a ninth configuration, in the first configuration, the driver unit may further include a CR circuit disposed close to the source driver IC on the flexible substrate. The CR circuit may include a capacitor and a resistor. The source driver IC may include a power supply circuit.

In the active matrix device according to a tenth configuration, in the first configuration, a width of the flexible substrate may be larger than 70 mm in a direction in which the first output terminal is disposed.

In the active matrix device according to an eleventh configuration, in the first configuration, the driver unit may further include a sensor supported by the flexible substrate.

In the active matrix device according to a twelfth configuration, in the first configuration, the driver unit may further include a sensor circuit having a matrix-shaped detection unit.

In the active matrix device according to a thirteenth configuration, in any one of the first to twelfth configurations, the active matrix device may further include a display panel including the active matrix substrate. The display panel may be one selected from a group consisting of a liquid crystal display panel, an organic EL display panel, a micro LED display panel, and an electrophoretic display panel. The driver unit may include the demultiplexer circuit.

In the active matrix device according to a fourteenth configuration, in any one of the first to fourth configurations, the active matrix device may further include a sensor panel including the active matrix substrate. The driver unit may include the multiplexer circuit.

The present disclosure contains subject matter related to that disclosed in Japanese Priority Patent Application JP 2022-182629 filed in the Japan Patent Office on Nov. 15, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An active matrix device comprising:
an active matrix substrate including:
   a substrate,
   a plurality of pixels disposed on the substrate,
   a plurality of source bus lines connected to the plurality of pixels, and
   a first substrate terminal disposed on the substrate and connected to each of the plurality of source bus lines; and
a driver unit including:
   a flexible substrate,
   a first wiring pattern disposed on the flexible substrate,
   a demultiplexer circuit or a multiplexer circuit supported by the flexible substrate and connected to the first wiring pattern,
   a source driver integrated circuit (IC) disposed on the flexible substrate and connected to the first wiring pattern,
   a first output terminal disposed on the flexible substrate and connected to the first wiring pattern, and
   a protection circuit disposed on the flexible substrate and connected to the first wiring pattern,
wherein:
   the first output terminal is connected to the first substrate terminal,
   the plurality of pixels includes a first thin film transistor (TFT),
   the demultiplexer circuit, or the multiplexer circuit, includes a second TFT,
   the first TFT of the plurality of pixels and the second TFT of the demultiplexer circuit, or the multiplexer circuit, have semiconductors different from each other, and
   the protection circuit has a protection element and protects the demultiplexer circuit,
   or the multiplexer circuit, from at least one of static electricity and an overvoltage.
2. The active matrix device according to claim 1, wherein the first TFT of the plurality of pixels has an oxide semiconductor, and
the second TFT of the demultiplexer circuit, or the multiplexer circuit, has polysilicon.
3. The active matrix device according to claim 1, wherein the first TFT of the plurality of pixels has amorphous silicon, and
the second TFT of the demultiplexer circuit, or the multiplexer circuit, has an oxide semiconductor or polysilicon.
4. The active matrix device according to claim 1, wherein the first TFT of the plurality of pixels has an amorphous oxide semiconductor, and
the second TFT of the demultiplexer circuit, or the multiplexer circuit, has a crystalline oxide semiconductor.
5. The active matrix device according to claim 1, wherein the active matrix substrate further includes:
   a plurality of gate bus lines connected to the plurality of pixels, a plurality of connection lines connected to the plurality of gate bus lines and extending parallel to the plurality of source bus lines, and a second substrate terminal located on the substrate and connected to each of the plurality of connection lines, the driver unit further includes:

a second wiring pattern disposed on the flexible substrate, a gate driver disposed on the flexible substrate and connected to the second wiring pattern, and a second output terminal disposed on the flexible substrate and connected to the second wiring pattern, and the second substrate terminal is connected to the second output terminal.

6. The active matrix device according to claim 5, wherein the driver unit further includes another demultiplexer circuit or another multiplexer circuit connected to the second wiring pattern.

7. The active matrix device according to claim 1, wherein a width of the flexible substrate is larger than 70 mm in a direction in which the first output terminal is disposed.

8. The active matrix device according to claim 1, wherein the driver unit further includes a sensor supported by the flexible substrate.

9. The active matrix device according to claim 1, wherein the driver unit further includes a sensor circuit having a matrix-shaped detection unit.

10. The active matrix device according to claim 1, further comprising:

a display panel including the active matrix substrate, wherein the display panel is one selected from a group consisting of a liquid crystal display panel, an organic electroluminescent (EL) display panel, a micro light-emitting diode (LED) display panel, and an electrophoretic display panel, and the driver unit includes the demultiplexer circuit.

11. The active matrix device according to claim 1, further comprising:

a sensor panel including the active matrix substrate, wherein the driver unit includes the multiplexer circuit.

12. An active matrix device comprising:

an active matrix substrate including:

a substrate, a plurality of pixels disposed on the substrate, a plurality of source bus lines connected to the plurality of pixels, a first substrate terminal disposed on the substrate and connected to each of the plurality of source bus lines, a touch panel disposed to overlap the plurality of pixels, and a second substrate terminal disposed on the substrate and connected to the touch panel; and a driver unit including:

a flexible substrate, a first wiring pattern disposed on the flexible substrate, a demultiplexer circuit or a multiplexer circuit supported by the flexible substrate and connected to the first wiring pattern, a source driver integrated circuit (IC) disposed on the flexible substrate and connected to the first wiring pattern, a first output terminal disposed on the flexible substrate and connected to the first wiring pattern, a second wiring pattern disposed on the flexible substrate, a touch panel controller IC supported by the flexible substrate and connected to the second wiring pattern, and a second output terminal disposed on the flexible substrate and connected to the second wiring pattern, wherein:

the first output terminal is connected to the first substrate terminal, the plurality of pixels includes a first thin film transistor (TFT), the demultiplexer circuit, or the multiplexer circuit, includes a second TFT, the first TFT of the plurality of pixels and the second TFT of the demultiplexer circuit, or the multiplexer circuit, have semiconductors different from each other, and the second substrate terminal is connected to the second output terminal.

13. The active matrix device according to claim 12, wherein the driver unit further includes a sensor circuit having a matrix-shaped detection unit.

14. The active matrix device according to claim 12, further comprising:

a display panel including the active matrix substrate, wherein the display panel is one selected from a group consisting of a liquid crystal display panel, an organic electroluminescent (EL) display panel, a micro light-emitting diode (LED) display panel, and an electrophoretic display panel, and the driver unit includes the demultiplexer circuit.

15. The active matrix device according to claim 12, further comprising:

a sensor panel including the active matrix substrate, wherein the driver unit includes the multiplexer circuit.

16. An active matrix device comprising:

an active matrix substrate including:

a substrate, a plurality of pixels disposed on the substrate, a plurality of source bus lines connected to the plurality of pixels, and a first substrate terminal disposed on the substrate and connected to each of the plurality of source bus lines; and a driver unit including:

a flexible substrate, a first wiring pattern disposed on the flexible substrate, a demultiplexer circuit or a multiplexer circuit supported by the flexible substrate and connected to the first wiring pattern, a source driver integrated circuit (IC) disposed on the flexible substrate and connected to the first wiring pattern, a first output terminal disposed on the flexible substrate and connected to the first wiring pattern, and a capacitor-resistor (CR) circuit disposed close to the source driver IC on the flexible substrate, wherein:

the first output terminal is connected to the first substrate terminal, the plurality of pixels includes a first thin film transistor (TFT), the demultiplexer circuit, or the multiplexer circuit, includes a second TFT, the first TFT of the plurality of pixels and the second TFT of the demultiplexer circuit, or the multiplexer circuit, have semiconductors different from each other, the CR circuit includes a capacitor and a resistor, and
the source driver IC includes a power supply circuit.

17. The active matrix device according to claim 16, wherein the driver unit further includes a sensor circuit having a matrix-shaped detection unit.

18. The active matrix device according to claim 16, further comprising:

a display panel including the active matrix substrate,
wherein the display panel is one selected from a group consisting of a liquid crystal display panel, an organic electroluminescent (EL) display panel, a micro light-emitting diode (LED) display panel, and an electro-phoretic display panel, and the driver unit includes the demultiplexer circuit.

19. The active matrix device according to claim 16, further comprising:

a sensor panel including the active matrix substrate,
wherein the driver unit includes the multiplexer circuit.

\* \* \* \* \*